United States Patent
Han et al.

(10) Patent No.: US 12,340,721 B2
(45) Date of Patent: Jun. 24, 2025

(54) HINGE DEVICE AND DISPLAY APPARATUS INCLUDING THE SAME

(71) Applicant: SAMSUNG ELECTRONICS CO., LTD., Suwon-si (KR)

(72) Inventors: Changmin Han, Suwon-si (KR); Minjae Shin, Suwon-si (KR); Hyeonggwon Kim, Suwon-si (KR); Kyeong Namkoong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/745,538

(22) Filed: Jun. 17, 2024

(65) Prior Publication Data

US 2025/0061829 A1 Feb. 20, 2025

Related U.S. Application Data

(63) Continuation of application No. PCT/KR2024/006214, filed on May 9, 2024.

(30) Foreign Application Priority Data

Aug. 18, 2023 (KR) .................. 10-2023-0108637

(51) Int. Cl.
*G09G 3/20* (2006.01)
*G06F 1/16* (2006.01)
(Continued)

(52) U.S. Cl.
CPC ............. *G09G 3/20* (2013.01); *G06F 1/1681* (2013.01); *H04R 1/028* (2013.01); *H04R 1/403* (2013.01);
(Continued)

(58) Field of Classification Search
CPC . G09G 3/20; H04R 3/12; H04R 1/403; H05K 5/0226
See application file for complete search history.

(56) References Cited

U.S. PATENT DOCUMENTS 7,706,848 B2  4/2010  Won
10,013,227 B2 7/2018 Hyun et al.
(Continued)

FOREIGN PATENT DOCUMENTS

CN  111399594 A   7/2020
JP   4196842 B2  12/2008
(Continued)

OTHER PUBLICATIONS

International Search Report (PCT/ISA/210) issued by the International Searching Authority on Aug. 29, 2024 in corresponding International Application No. PCT/KR2024/006214.
(Continued)

*Primary Examiner* — Abbas I Abdulselam
(74) *Attorney, Agent, or Firm* — Sughrue Mion, PLLC

(57) ABSTRACT

A display apparatus including: a first display; a second display disposed adjacent to the first display; a hinge rotatably coupling the first display and the second display, the hinge including a first hinge portion at a side of the first display and a second hinge portion rotatably coupled to the first hinge portion and at a side of the second display; a light emitter on the first hinge portion; a light receiver on the second hinge portion; and a controller configured to control the first display and the second display based on an intensity of light received by the light receiver while the light emitter outputs the light.

20 Claims, 21 Drawing Sheets

(51) Int. Cl.
   *H04R 1/02*  (2006.01)
   *H04R 1/40*  (2006.01)
   *H04R 3/12*  (2006.01)
   *H05K 5/02*  (2006.01)

(52) U.S. Cl.
   CPC ............ *H04R 3/12* (2013.01); *H05K 5/0226* (2013.01); *G09G 2300/026* (2013.01); *G09G 2320/0626* (2013.01); *G09G 2320/066* (2013.01); *G09G 2356/00* (2013.01); *G09G 2360/04* (2013.01); *H04R 2499/15* (2013.01)

(56) References Cited

U.S. PATENT DOCUMENTS

| | | | |
|---|---|---|---|
| 11,513,566 | B2 | 11/2022 | Kim et al. |
| 11,803,190 | B2 | 10/2023 | Lee et al. |
| 11,849,201 | B2 | 12/2023 | Lee et al. |
| 2004/0239258 | A1* | 12/2004 | Seki ................. G09G 3/3233 315/169.3 |
| 2023/0251692 | A1 | 8/2023 | Kang et al. |

FOREIGN PATENT DOCUMENTS

| | | |
|---|---|---|
| JP | 2011-035590 A | 2/2011 |
| KR | 10-2007-0075634 A | 7/2007 |
| KR | 10-2017-0046969 A | 5/2017 |
| KR | 10-2020-0140609 A | 12/2020 |
| KR | 10-2375556 B1 | 7/2022 |
| KR | 10-2022-0147962 A | 11/2022 |
| WO | 2017/191928 A1 | 11/2017 |

OTHER PUBLICATIONS

Written Opinion (PCT/ISA/237) issued by the International Searching Authority on Aug. 29, 2024 in corresponding International Application No. PCT/KR2024/006214.

\* cited by examiner

HINGE DEVICE AND DISPLAY APPARATUS INCLUDING THE SAME

CROSS-REFERENCE TO RELATED APPLICATIONS

This application is a bypass continuation of International Application No. PCT/KR2024/006214, filed on May 9, 2024, which claims priority under 35 U.S.C. § 119 to Korean Patent Application No. 10-2023-0108637, filed on Aug. 18, 2023, in the Korean Intellectual Property Office, the disclosures of which are incorporated by reference herein in their entireties.

BACKGROUND

1. Field

The disclosure relates to a hinge device and a display apparatus including the same.

2. Brief Description of Background Art

A display apparatus is a type of an output apparatus that converts obtained or stored electrical information into visual information and displays the visual information to users.

Display apparatuses are classified into a light-emitting type display apparatus including a display panel that emits light by itself, such as an organic light-emitting diode (OLED), and a light-receiving type display apparatus including a display panel that needs to receive light from a backlight unit without emitting light by itself, such as a liquid crystal display (LCD).

A display apparatus may include a plurality of displays. The display apparatus may connect the plurality of displays using a hinge device such that the same image is displayed or different images are displayed. In this case, there is a need for a user to appropriately adjust the brightness and contrast of the displays, the volume of the speakers, and the like according to the angle formed by the plurality of displays.

SUMMARY

Provided are a hinge device capable of electrically connecting a plurality of displays, and a display apparatus including the same.

Further, provided are a hinge device capable of controlling a plurality of displays without an additional manipulation by a user based on the angle between the plurality of displays, and a display apparatus including the same.

Technical aspects of embodiments of the present disclosure are not limited to the above, and other aspects that are not described above may become apparent to those of ordinary skill in the art based on the following description.

According to an aspect of the disclosure, a display apparatus may be provided and include: a first display; a second display adjacent to the first display; a hinge rotatably coupling the first display and the second display, the hinge comprising a first hinge portion at a side of the first display, and a second hinge portion rotatably coupled to the first hinge portion and at a side of the second display; a light emitter on the first hinge portion; a light receiver on the second hinge portion; and a controller configured to control the first display and the second display based on an intensity of light received by the light receiver while the light emitter outputs the light.

According to an aspect of the disclosure, a display apparatus may be provided and include: a first display; a second display adjacent to the first display; a hinge rotatably coupling the first display and the second display, the hinge including a first hinge portion at a side of the first display, and a second hinge portion rotatably coupled to the first hinge portion and at a side of the second display; a light emitter on the first hinge portion, the light emitter comprising a first substrate, and a light source electrically connected to the first substrate and configured to emit light; and a light receiver on the second hinge portion, the light receiver comprising a second substrate, and at least one sensor electrically connected to the second substrate and configured to detect the light emitted from the light source, wherein the first substrate extends in a direction perpendicular to an extension direction of the first hinge portion while the first substrate is coupled to the first hinge portion such that the light source is configured to emit light toward the at least one sensor.

According to an aspect of the disclosure, a method may be provided. The method may be performed by a display apparatus that includes a first display, a second display adjacent to the first display, and a hinge rotatably coupling the first display and the second display. The method may include: emitting light by a light emitter, wherein the light emitter is on a first hinge portion of the hinge that is at a side of the first display; receiving the light by a light receiver, wherein the light receiver is on a second hinge portion of the hinge that is rotatably coupled to the first hinge portion and at a side of the second display; and controlling, by a controller of the display apparatus, the first display and the second display based on an intensity of the light received by the light receiver while the light emitter outputs the light.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
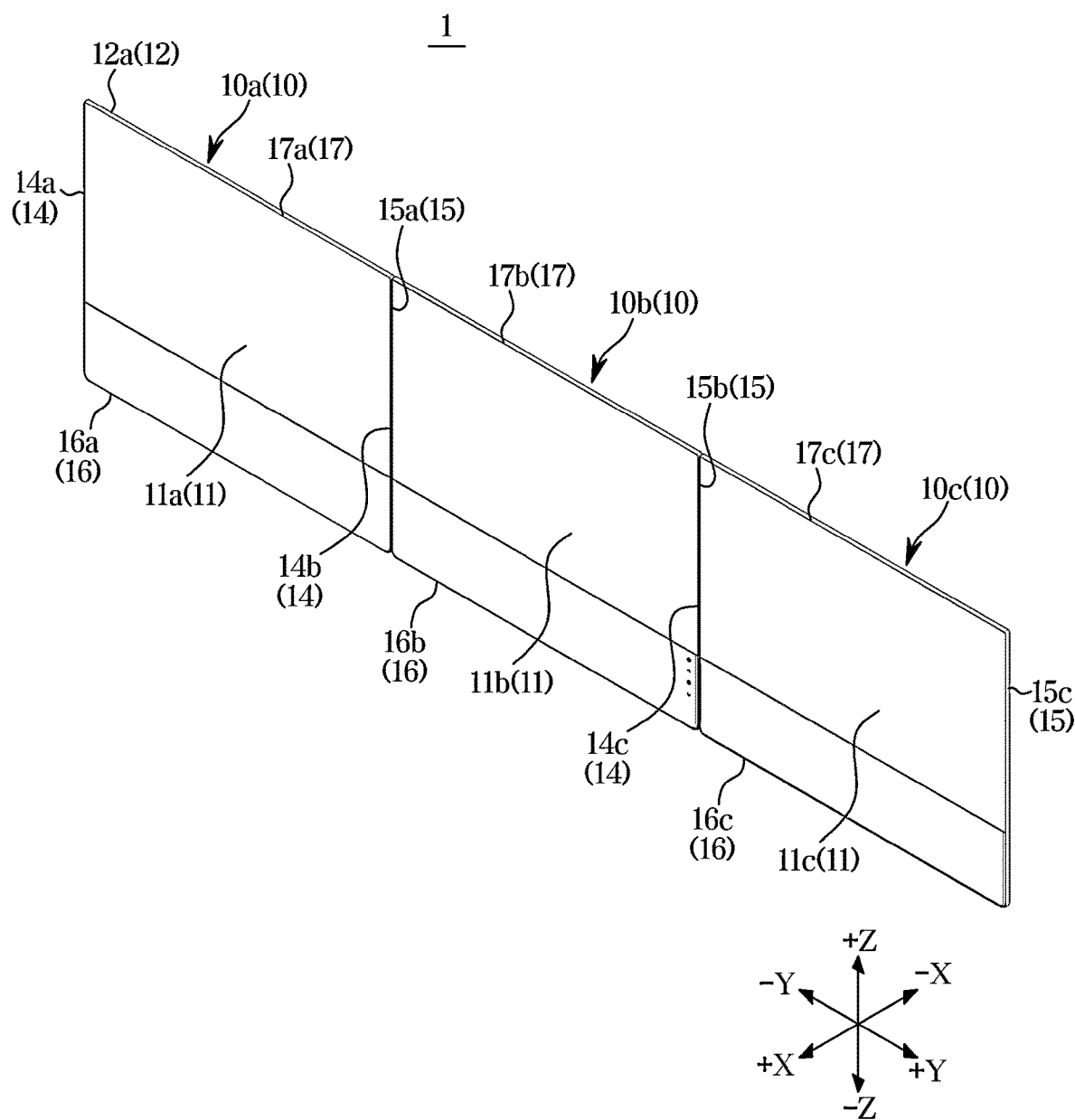
FIG. 1 is a perspective view illustrating a display apparatus according to an embodiment.

The example embodiments described in the disclosure, including the example embodiments shown in the drawings, are only examples of the disclosure, and various modifications may be made at the time of filing of the disclosure, which are included in the scope of the disclosure.

In the description of the drawings, like numbers refer to like elements throughout the description of the drawings.

The terms used herein are for the purpose of describing example embodiments and are not intended to restrict and/or to limit the disclosure. The singular expressions herein may include plural expressions, unless the context clearly dictates otherwise. In addition, the terms "comprises," "includes," and "has" are intended to indicate that there are features, numbers, steps, operations, elements, parts, or combinations thereof described in the disclosure, and do not exclude the presence or addition of one or more other features, numbers, steps, operations, elements, parts, or combinations thereof.

In the disclosure, a phrase such as "A or B," "at least one of A and B," "at least one of A or B," "A, B or C," "at least one of A, B and C," and "at least one of A, B, or C" may include any one of the items listed together in the corresponding phrase of the phrases, or any possible combination thereof.

The term "and/or" includes combinations of one or all of a plurality of associated listed elements.

It will be understood that, although the terms first, second, etc. used in the disclosure may be used herein to describe various components, these components should not be limited by these terms. These terms are only used to distinguish one component from another. For example, a first element could be termed a second element, and similarly, a second element could be termed a first element without departing from the scope of the disclosure. The term "and/or" includes combinations of one or all of a plurality of associated listed items.

In addition, the meaning of "identical" or "same" in the disclosure may include having similar properties or similarity within a certain range. In addition, "identical" or "same" refers to "substantially identical". It should be understood that the meaning of "substantially identical" refers to a value that falls within an error range in manufacturing or a value having a difference within a range that does not have significance with respect to a reference value.

The terms, such as "~part," "~device," "~block," "~member," "~module," and the like may refer to a unit for processing at least one function or act. For example, the terms may refer to at least process processed by at least one hardware, such as a field-programmable gate array (FPGA) and/or application specific integrated circuit (ASIC), software stored in memories, or processors.

In the following description, the terms "front to rear direction," "front side," "rear side," "lateral direction," "horizontal direction," "right side," "left side," "upper to lower direction," "vertical direction," "upper side," and "lower side are defined based on the directions illustrated in the drawings, but the terms need not restrict the shape and position of the respective components. For example, a direction in which an image is displayed with respect to a display apparatus 1 shown in FIG. 1 may be defined as a forward direction (+X direction), and a direction opposite to the forward direction may be defined as a rearward direction (−X direction). For example, a direction in which a plurality of displays 10 are arranged may be defined as a lateral direction (or a horizontal direction) (Y directions). However, this is only designated with reference to the drawings for the sake of convenience of description, and is not limited thereto.

Hereinafter, non-limiting example embodiments according to the present disclosure are described in detail with reference to the accompanying drawings.

For the sake of convenience of description, the following description is made in relation to an example in which a display 10, included in a display apparatus 1, is a monitor. However, the display 10 according to embodiments of the present disclosure are not limited to a monitor. For example, the display 10 according to embodiments of the present disclosure may also be applied to televisions (TVs), smart phones, tablet PCs and other devices.

In addition, the display apparatus 1 including a display 10, that is flat, is illustrated in the drawings, but the display 10 according to embodiments of the present disclosure may also be a curved display, or a bendable or flexible display that may be transformed to be in a flat surface state or a curved surface state.

Figure 2:
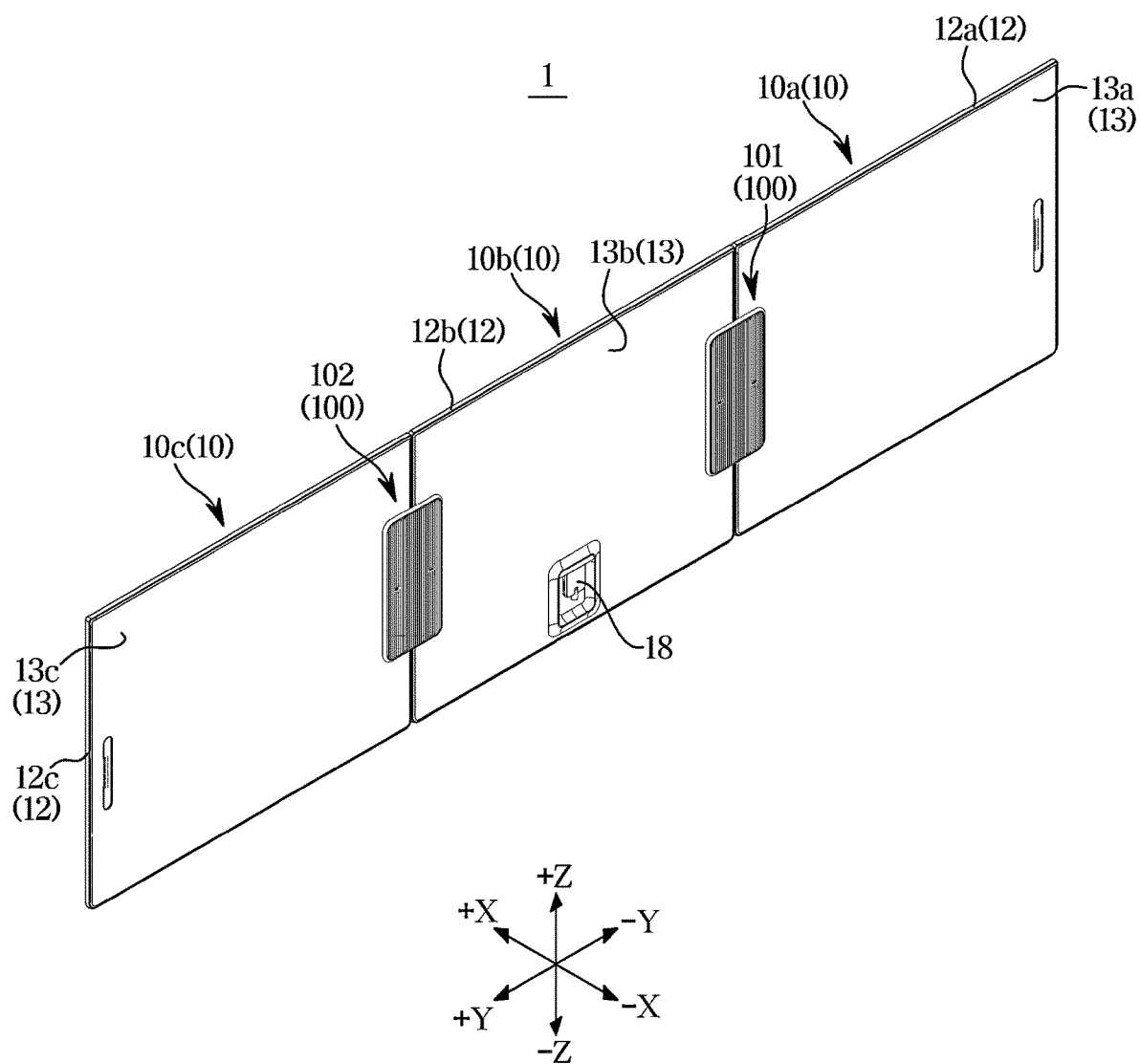
FIG. 2 is a perspective view illustrating a display apparatus according to an embodiment.

FIG. 1 is a perspective view illustrating a display apparatus according to an embodiment, and FIG. 2 is a perspective view illustrating the display apparatus according to the embodiment. FIG. 1 is a front perspective view of the display apparatus, and FIG. 2 is a rear perspective view of the display apparatus.

Referring to FIGS. 1 and 2, a display apparatus 1 according to an embodiment may include a plurality of displays 10. The display apparatus 1 may include two or more displays 10.

For example, the display apparatus 1 may include a first display 10a and a second display 10b disposed adjacent to one side of the first display 10a. For example, the display apparatus 1 may include a second display 10b, a first display 10a disposed adjacent to one side of the second display 10b, and a third display 10c disposed adjacent to the other side of the second display 10b.

For example, for the sake of convenience of description, the display disposed in the center among the plurality of displays 10 may be referred to as the second display 10b. Additionally, the displays provided on both sides of the second display 10b may be referred to as the first display 10a and the third display 10c. For example, the display disposed on the left side of the second display 10b may be referred to as the first display 10a, and the display disposed on the right side of the second display 10b may be referred to as the third display 10c. However, in the first display 10a, the second display 10b, and the third display 10c, the ordinal numbers such as "first," "second," and "third" are not interpreted limitedly by the use of the ordinal numbers. For example, a display located in the center among the plurality of displays 10 may be referred to as a first display, a display located on the left side of the first display 10a may be referred to as a second display, and a display located on the right side of the first display may be referred to as a third display.

Additionally, in the drawings, the display apparatus 1 is illustrated as including three displays (i.e., the first display 10a, the second display 10b, and the third display 10c), but embodiments of the present disclosure are not limited thereto. The display apparatus 1 may include four or more displays. The display apparatus 1 may include two displays.

Each display 10 may be provided with a lateral side and a longitudinal side that have different lengths. That is, each display 10 may be provided to have a long side and a short side. Each display 10 may be provided in a rectangular plate shape. However, embodiments of the present disclosure are not limited thereto, and each display 10 may be provided in a square plate shape with sides having the same length. Each display 10 may be provided in a different size.

For example, each display 10 may include a first side portion 14 extending approximately along the vertical direction (Z directions) and a second side portion 15 spaced apart from the first side portion 14 and extending approximately along the vertical direction (Z directions). The first side portion 14 and the second side portion 15 may be spaced apart from each other in the lateral direction (Y directions). The first side portion 14 and the second side portion 15 may be provided as short sides. For example, each display 10 may include a third side portion 16 extending approximately along the lateral direction (Y directions) and a fourth side portion 17 spaced apart from the third side portion 16 and extending approximately along the lateral (Y directions). The third side portion 16 may connect the lower end of the first side portion 14 and the lower end of the second side portion 15. The fourth side portion 17 may connect the upper end of the first side portion 14 and the upper end of the second side portion 15. The third side portion 16 and the fourth side portion 17 may be spaced apart from each other in the upper to lower direction (Z directions). The third side portion 16 and the fourth side portion 17 may be provided as long sides. In the first side portion 14, the second side portion 15, the third side portion 16, and the fourth side portion 17, the ordinal numbers such as "first," "second," "third" and "fourth" are not interpreted limitedly by the use of the ordinal numbers.

According to embodiments, the first display 10a may include a first side portion 14a, a second side portion 15a, a third side portion 16a, and a fourth side portion 17a. The second display 10b may include a first side portion 14b, a second side portion 15b, a third side portion 16b, and a fourth side portion 17b. The third display 10c may include a first side portion 14c, a second side portion 15c, a third side portion 16c, and a fourth side portion 17c.

Based on the above, for example, the second side portion 15a of the first display 10a may be adjacent to the first side portion 14b of the second display 10b. Based on the above, for example, the second side portion 15b of the second display 10b may be adjacent to the first side portion 14c of the third display 10c.

Each display 10 may receive content data including video signals and audio signals from various content sources, and output video and audio respectively corresponding to the video signals and the audio signals. For example, each display 10 may receive content data through a broadcast reception antenna or a wired cable, receive content data from a content reproduction device, or receive content data from a content providing server of a content provider.

Each display 10 may be configured to display a screen. Each display 10 may include a display panel 11 provided to display an image on a front side thereof. For example, the front side of at least one display 10 may form the front side of the display apparatus 1.

A screen may be displayed on a front of each display panel 11. For example, a screen display area may be formed on the front side of each display panel 11. A plurality of pixels may be formed in the screen display area, and an image displayed in the screen display area may be formed by a combination of lights individually emitted from the plurality of pixels. For example, a single image may be formed on the screen display area by combining lights emitted from the plurality of pixels as a mosaic.

Each of the plurality of pixels may emit light at different brightness and in different colors. Specifically, each of the plurality of pixels may include sub-pixels, in which the subpixels may include a red subpixel emitting red light, a green subpixel emitting green light, and a blue subpixel emitting blue light. Each of the plurality of pixels may emit light at various brightness and in different colors by a combination of lights emitted from the red subpixel, the green subpixel, and the blue subpixel.

The display panel 11 may be a light-emitting display panel, such as an organic light-emitting diode (OLED) or a light-receiving display panel, such as a liquid crystal display (LCD). There is no limitation on the type of the display panel 11, and each display 10 may include various types of display panels 11.

When the display panel 11 is an LCD panel, the display panel 11 may include a thin film transistor (TFT) substrate with TFTs arranged thereof in the form of a matrix, a color filter substrate coupled in parallel with the TFT substrate, liquid crystal molecules injected between the TFT substrate and the color filter substrate in which the liquid crystal molecules have optical properties that vary based on changes in voltage or temperature. Additionally, a back light unit (BLU) may be provided inside of a case 12. The BLU may be disposed at a rear of the display panel 11 to emit light toward the display panel 11. In this case, the display panel 11 may block or pass light emitted from the BLU. However, embodiments of the present disclosure are not limited thereto, and as described above, the display panel 11 may be a light-emitting display panel, such as an OLED panel.

The first display 10a may include a first display panel 11a. The second display 10b may include a second display panel 11b. The third display 10c may include a third display panel 11c.

Each display 10 may include a case 12 provided to accommodate the display panel 11. The case 12 may form at least a portion of the exterior of the display 10. Inside the case 12, components for the display 10 to display images or perform various functions, such as the display panel 11, may be accommodated.

The case 12 may be provided to support and/or fix the display panel 11. The case 12 may be provided to cover the rear side of the display panel 11. For example, the rear side of the case 12 may form the rear side of the display apparatus 1.

For example, the case 12 may be provided in the form of an assembly in which a plurality of components are combined.

The case 12 may be referred to as a chassis, a frame, a mold, a cover, and the like.

The first display 10a may include a first case 12a. The second display 10b may include a second case 12b. The third display 10c may include a third case 12c.

One of the plurality of displays 10 may be provided with a port 18 configured to receive power and/or signals from the outside. For example, the port 18 may be formed on a rear 13b of the second display 10b. As will be described below, the plurality of displays 10 may be electrically connected to each other by a hinge device 100, and thus the port 18 may not be formed in each of the plurality of displays 10. For example, one display (e.g., the second display 10b), in which the port 18 is formed, may be configured to share power or signals with at least one other display (e.g., the first display 10a and the third display 10c), in which the port 18 is not formed, through the hinge device 100. Accordingly, the number of ports 18 and the number of cables connected to the ports 18 may be reduced, and the display apparatus 1 may have an esthetically pleasing appearance. However, in some cases, the port 18 may be formed on each of the plurality of displays 10 or on some of the plurality of displays 10.

The display apparatus 1 may include a hinge device 100. The hinge device 100 may be configured to physically and/or electrically connect the plurality of displays 10. For example, when the display apparatus 1 includes a first display 10a and a second display 10b, the hinge device 100 may be configured to physically and electrically connect the first display 10a and the second display 10b. The hinge device 100 may be provided as a plurality of hinge devices 100. For example, when the display apparatus 1 includes a first display 10a, a second display 10b, and a third display 10c, the plurality of hinge devices 100 may be configured to physically and/or electrically connect the first display 10a, the second display 10b, and the third display 10c to each other. For example, the plurality of hinge devices 100 may include a first hinge device 101 connecting the first display 10a and the second display 10b, and a second hinge device 102 connecting the second display 10b and the third display 10c.

The hinge device 100 may be detachably coupled to the rears 13 of the plurality of displays 10. The hinge device 100 may cover a portion of the rears 13 of the plurality of displays 10.

Figure 3:
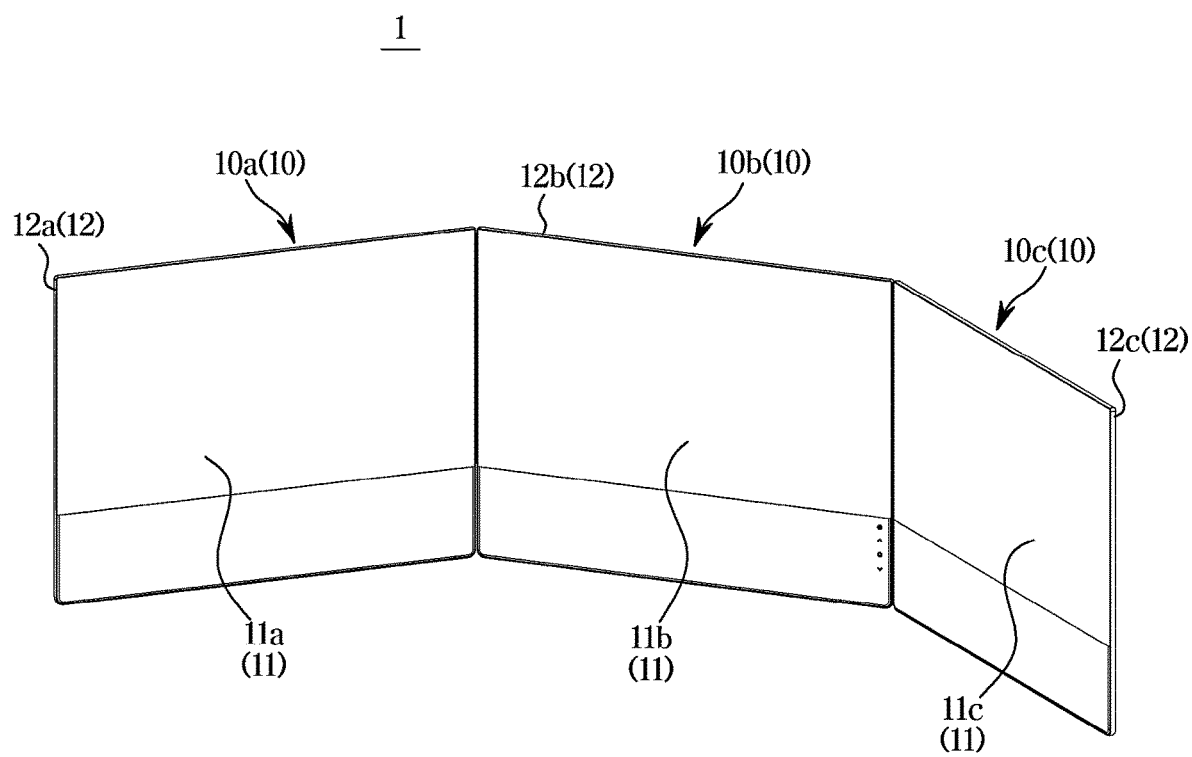
FIG. 3 is a perspective view illustrating a state in which a display apparatus according to an embodiment is folded.
Figure 4:
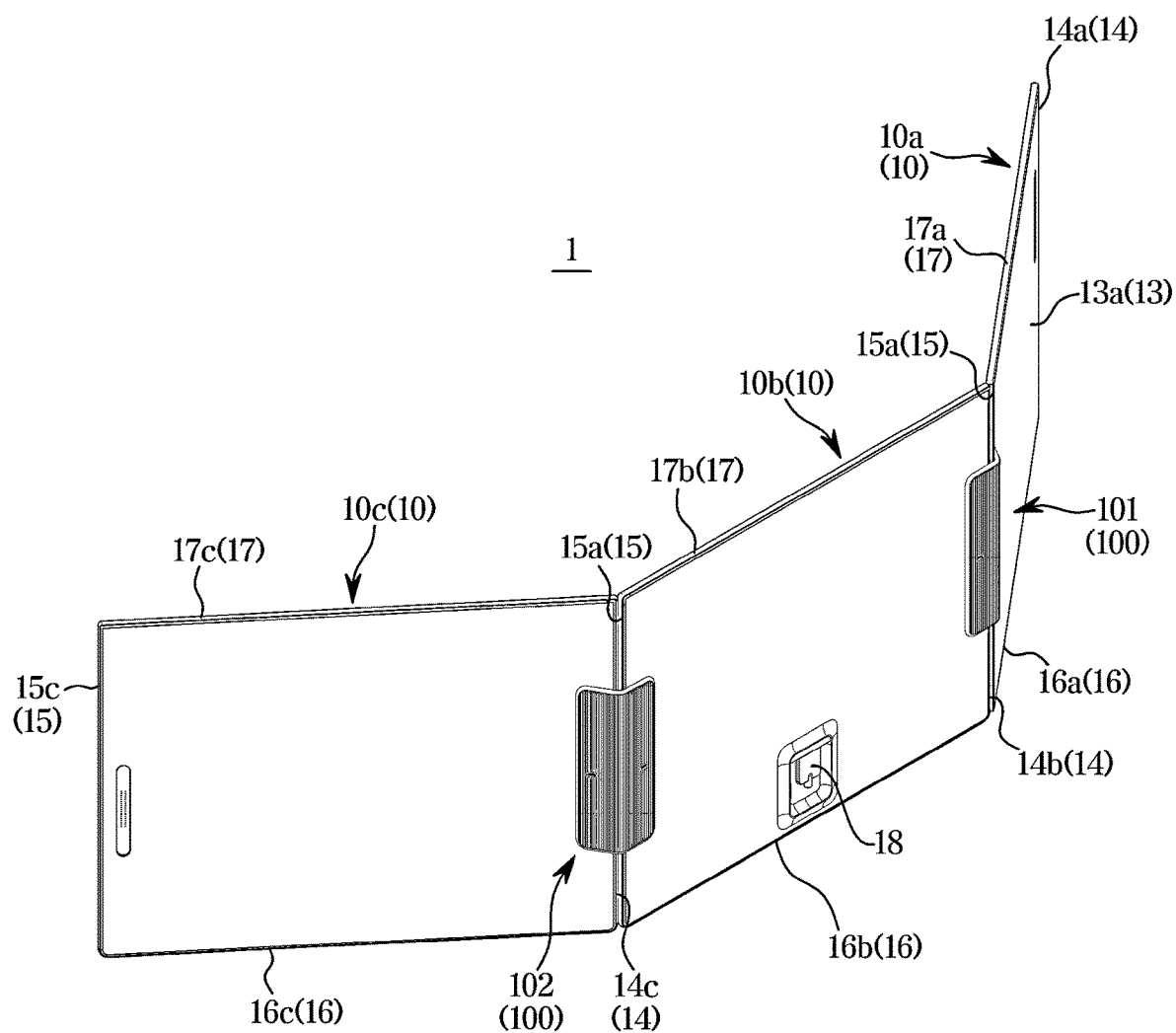
FIG. 4 is a perspective view illustrating a state in which a display apparatus according to an embodiment is folded.

FIG. 3 is a perspective view illustrating a state in which the display apparatus according to the embodiment is folded. FIG. 4 is a perspective view illustrating a state in which the display apparatus according to the embodiment is folded. FIG. 3 is a front perspective view of the display apparatus, and FIG. 4 is a rear perspective view of the display apparatus.

The angle between neighboring displays 10 among the plurality of displays 10 may vary. The neighboring displays 10 among the plurality of displays 10 may be configured to be foldable and/or tiltable.

The neighboring displays 10 may be configured to be foldable and/or tiltable by the hinge device 100. The angle between the neighboring displays 10 may be adjusted by the hinge device 100.

In FIGS. 3-4, the first display 10a is folded and/or tilted within a predetermined range with respect to the second display 10b, and the third display 10c is folded and/or tilted within a predetermined range with respect to the second display 10b. However, embodiments of the present disclosure are not limited thereto. For example, the second display 10b and the third display 10c may each be folded and/or tilted within a predetermined range with respect to the first display 10a. For example, the first display 10a and the second display 10b may each be folded and/or tilted within a predetermined range with respect to the third display 10c.

Figure 5:
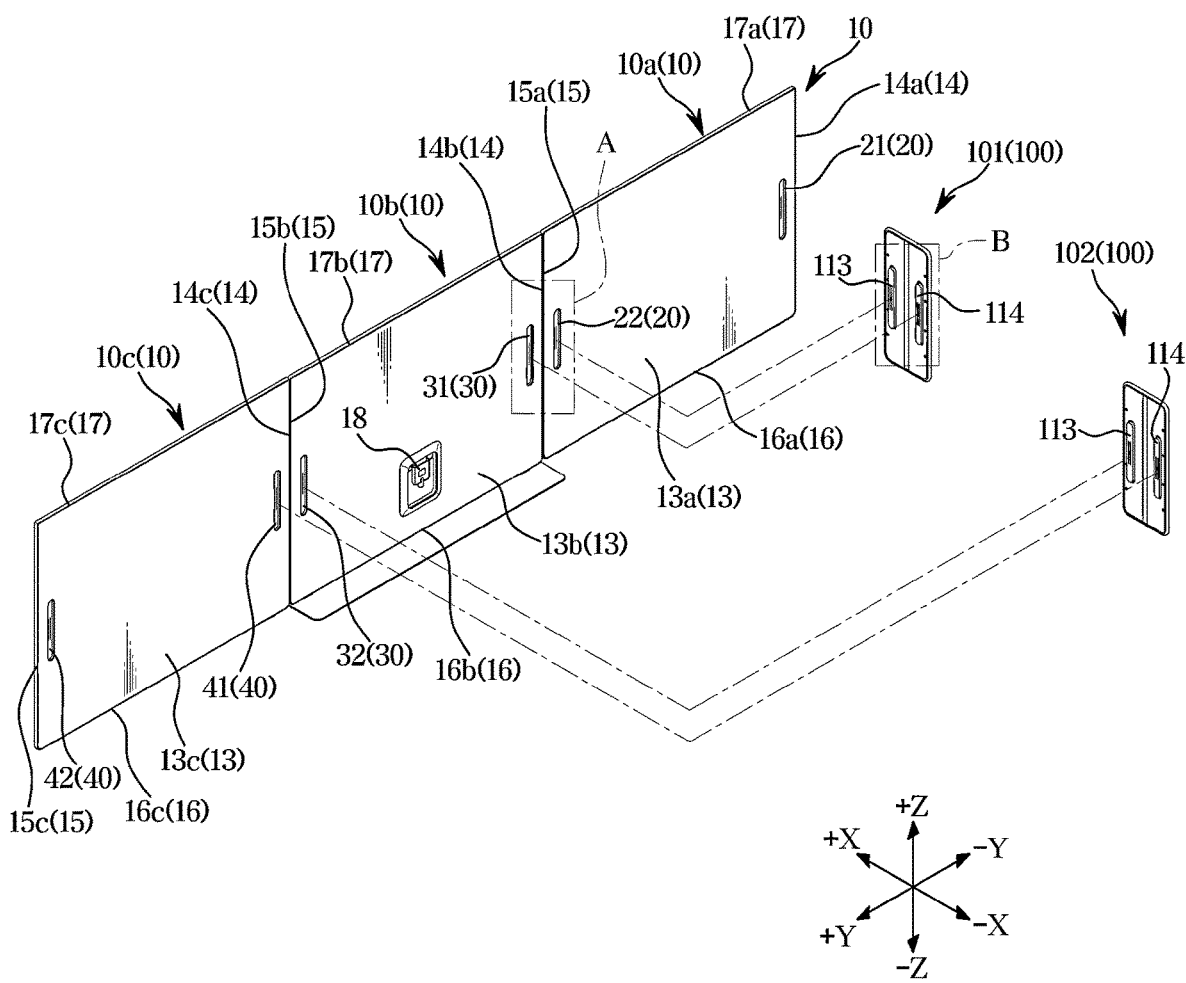
FIG. 5 is an exploded perspective view of a display apparatus according to an embodiment.
Figure 6:
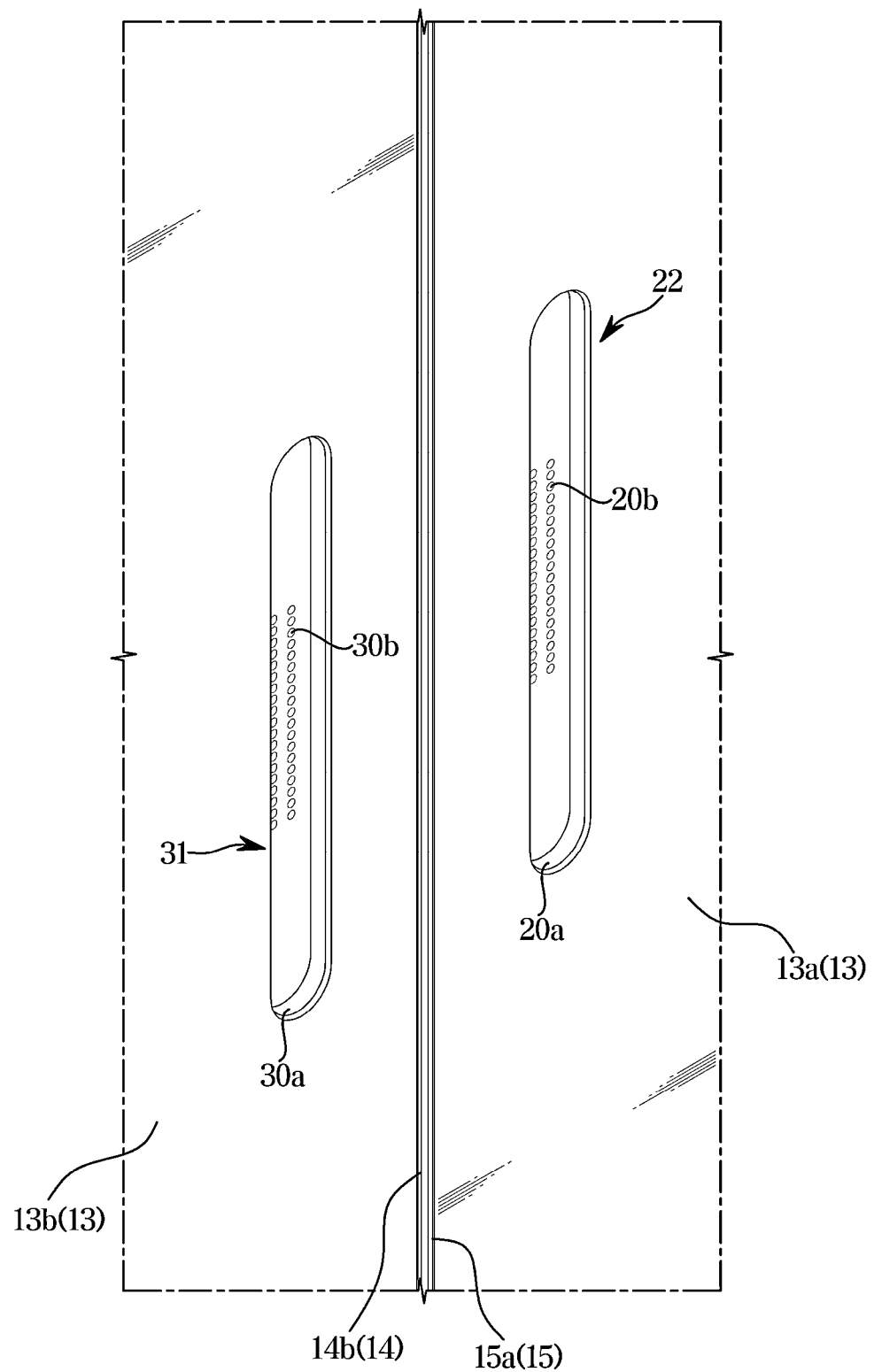
FIG. 6 is an enlarged view of a display in a display apparatus according to an embodiment.
Figure 7:
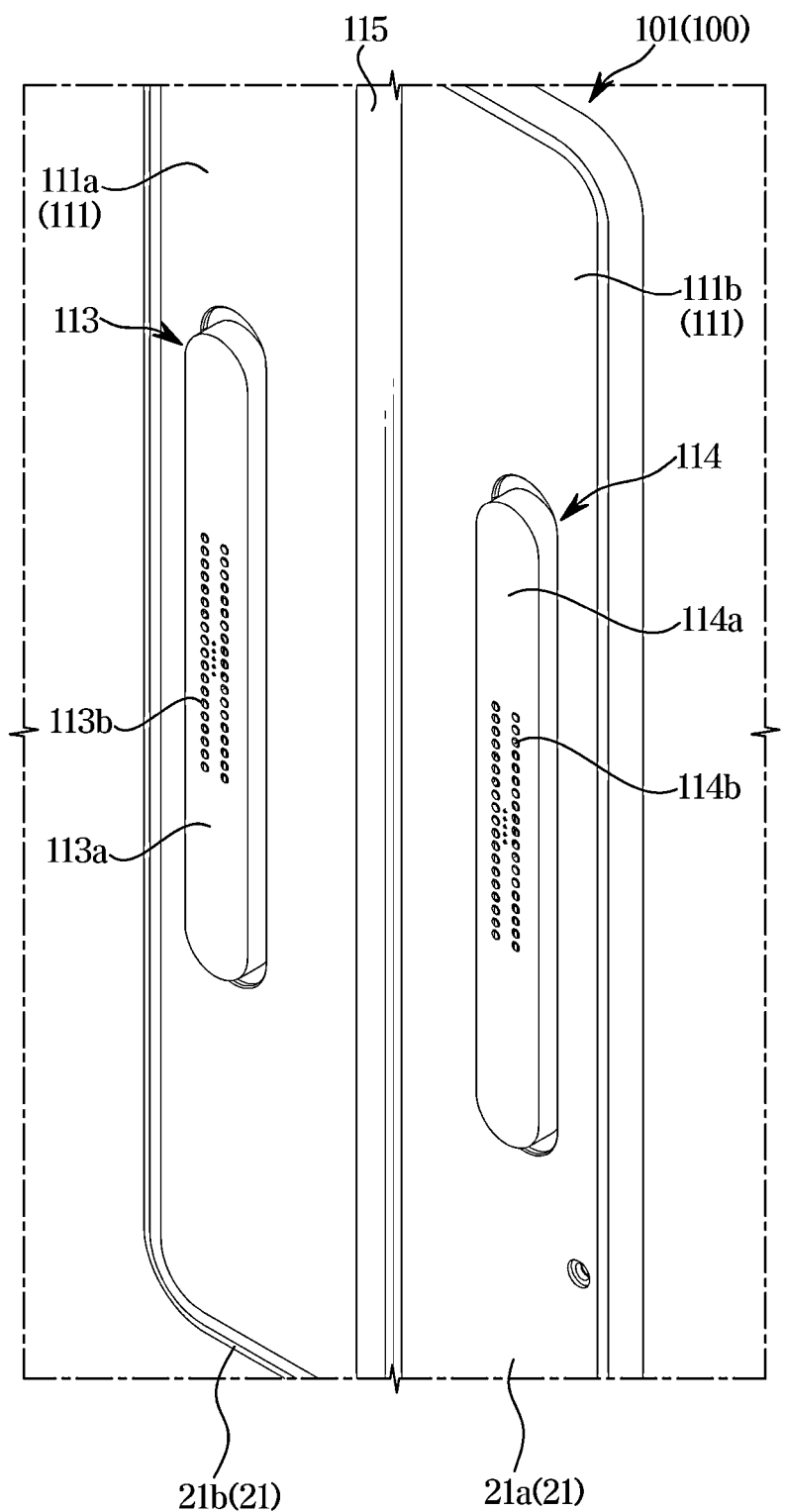
FIG. 7 is an enlarged perspective view of a hinge device in a display apparatus according to an embodiment.
Figure 8:
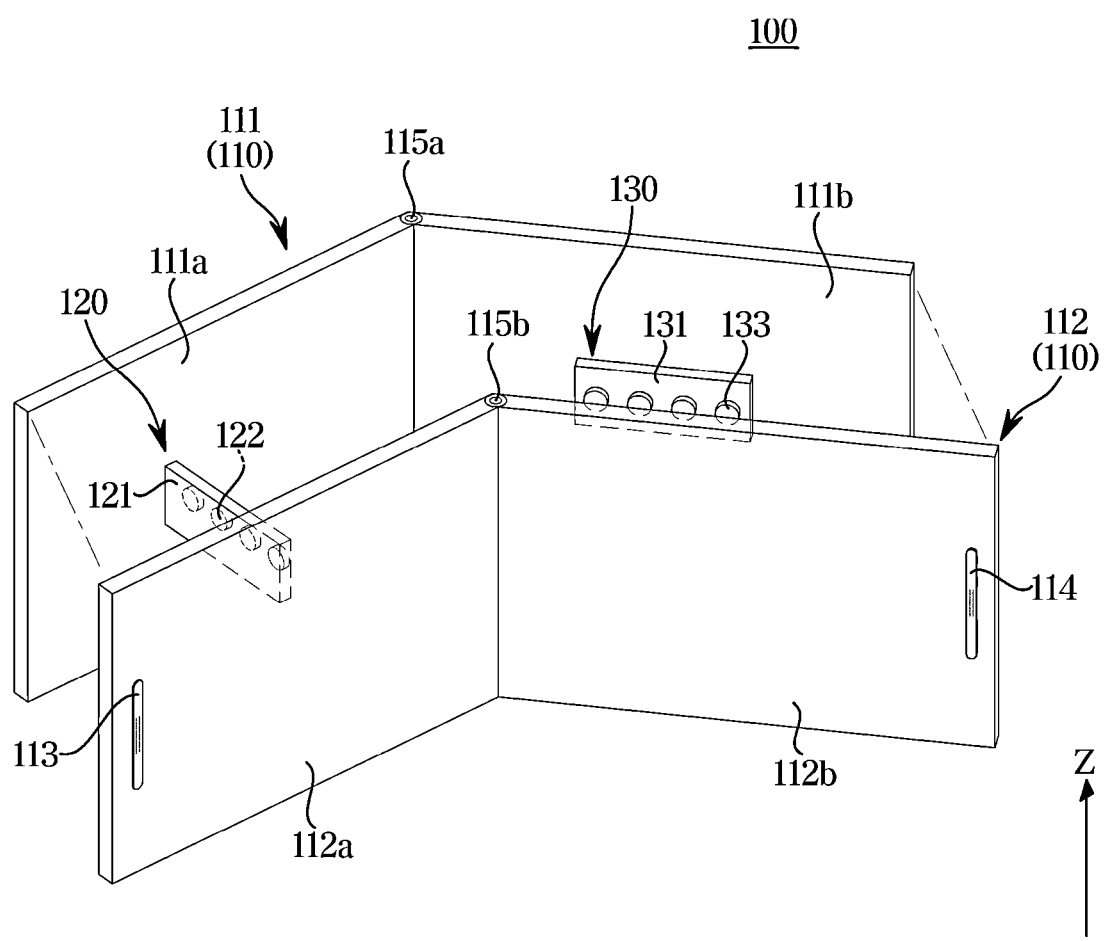
FIG. 8 is an exploded perspective view schematically illustrating a hinge device in a display apparatus according to an embodiment.

FIG. 5 is an exploded perspective view of the display apparatus according to the embodiment. FIG. 6 is an enlarged view of the display in the display apparatus according to the embodiment. FIG. 6 illustrates area A shown in FIG. 5. FIG. 7 is an enlarged perspective view of the hinge device in the display apparatus according to the embodiment. FIG. 7 illustrates area B shown in FIG. 5. FIG. 8 is an exploded perspective view schematically illustrating the hinge device in the display apparatus according to the embodiment.

Each of the plurality of displays 10 may include at least one connector. The at least one connector may be formed on the rear 13 of each of the plurality of displays 10. For example, each display 10 may include two connectors each of which is adjacent to a corresponding one of the two side portions (e.g., the first side portion 14 and the second side portion 15). For example, each display 10 may include two connectors extending along the two side portions (e.g., the first side portion 14 and the second side portion 15), respectively.

The hinge device 100 may include connectors corresponding to the connectors of the plurality of displays 10. The hinge device 100 may include connectors that may be electrically connected to the connectors of the plurality of displays 10. The following description will be made based on the first hinge device 101, but may also be applied other hinge devices, such as the second hinge device 102.

For example, the connectors of the plurality of displays 10 may be connected to the connectors of the hinge device 100, respectively, in a pogo pin method. For example, the connector may be a pogo pin. However, this is only an example, and the connectors of the plurality of displays 10 may be electrically connected to the connectors of the hinge device 100 through various methods.

Meanwhile, connectors formed on the display 10 may be referred to as display side connectors (e.g., a first connector 20 and a second connector 30). Connectors formed on the hinge device 100 may be referred to as hinge side connectors (e.g., a third connector 113 and a fourth connector 114).

The following description is made based on an example in which the display apparatus 1 includes the first display 10a and the second display 10b. Contents of the first display 10a and the second display 10b correspond to an example of content about neighboring displays among the plurality of displays 10. Accordingly, contents of the first display 10a and the second display 10b may be equally applied to the second display 10b and the third display 10c. In addition, when the display apparatus 1 includes four or more displays 10, the contents of the first display 10a and the second display 10b may equally apply to neighboring displays among the plurality of displays.

The first display 10a may include a first connector 20. The first connector 20 may be formed on the rear 13a of the first display 10a. For example, the first connector 20 may have a shape extending approximately along the vertical direction (Z directions).

The first connector 20 may be provided as a plurality of first connectors. For example, the plurality of first connectors 20 may include a first connector 21 disposed adjacent to the first side portion 14a of the first display 10a and a first connector 22 disposed adjacent to the second side portion 15a of the first display 10a.

The second display 10b may include a second connector 30. The second connector 30 may be formed on the rear 13b of the second display 10b. For example, the second connector 30 may have a shape extending approximately along the vertical direction (Z directions).

The second connector 30 may be provided as a plurality of second connectors 30. For example, the plurality of second connectors 30 may include a second connector 31 disposed adjacent to the first side portion 14b of the second display 10b and a second connector 32 disposed adjacent to the second side portion 15b of the second display 10b.

The hinge device 100 may include a first hinge portion 111a that may be mounted on the first display 10a. The first hinge portion 111a may be mounted on the rear 13a of the first display 10a. The first hinge portion 111a may be formed to extend from a region between the first side portion 14a and the second side portion 15a of the first display 10a approximately in the lateral direction (Y directions). The first hinge portion 111a may be formed to extend from a region between the both side portions (e.g., the first side portion 14a and the second side portion 15a) of the first display 10a along a direction in which the first display 10a and the second display 10b are arranged.

The hinge device 100 may include a second hinge portion 111b that may be mounted on the second display 10b. The second hinge portion 111b may be mounted on the rear 13b of the second display 10b. The second hinge portion 111b may be formed to extend from a region between the first side portion 14b and the second side portion 15b of the second display 10b approximately in the lateral direction (Y directions). The second hinge portion 111b may be formed to extend from a region between the both side portions (e.g., the first side portion 14b and the second side portion 15b) of the second display 10b along a direction in which the first display 10a and the second display 10b are arranged.

The hinge device 100 may include a third connector 113 formed on the first hinge portion 111a and electrically connectable to the first connector 20. The third connector 113 may have a shape corresponding to a shape of the first connector 20.

The hinge device 100 may include a fourth connector 114 formed on the second hinge portion 111b and electrically connectable to the second connector 30. The fourth connector 114 may have a shape corresponding to a shape of the second connector 30.

The third connector 113 and the fourth connector 114 of the hinge device 100 may be electrically connected to each other. For example, the third connector 113 and the fourth connector 114 may be electrically connected to each other through an electronic circuit, cable, and the like.

As the hinge device 100 is mounted on the first display 10a and the second display 10b, the first connector 20 may be electrically connected to the third connector 113, and the second connector 30 may be electrically connected to the fourth connector 114. Accordingly, the first display 10a and the second display 10b may exchange power and/or signals with each other through the hinge device 100.

In addition, in the first connector, the second connector, the third connector, and the fourth connector, the ordinal numbers such as "first," "second," "third," and "fourth" are not interpreted limitedly by the use of the ordinal numbers. For example, a first connector may be provided on the first hinge portion and a fourth connector may be provided on the second hinge portion, or the display may include a third connector and/or a fourth connector.

Next, an example in which the display apparatus 1 includes a first display 10a, a second display 10b, and a third display 10c will be described. As described above, the contents of the first display 10a and the second display 10b may be equally applied to the first display 10a and the third display 10c, and contents that are the same as those described above may be omitted.

The third display 10c may include a fifth connector 40. The fifth connector 40 may be formed at the rear 13c of the third display 10c. For example, the fifth connector 40 may have a shape extending approximately along the vertical direction (Z directions).

The fifth connector 40 may be provided as a plurality of fifth connectors 40. For example, the plurality of fifth connectors 40 may include a fifth connector 41 disposed adjacent to the first side portion 14c of the third display 10c and a fifth connector 42 disposed adjacent to the second side portion 15c of the third display 10c.

Similar to the first hinge device 101, the second hinge device 102 may also include a first hinge portion 111a, a second hinge portion 111b, a third connector 113 and a fourth connector 114, and may electrically connect the second display 10b and the third display 10c.

Referring to FIG. 6, the first connector 20 will be described as an example of a display-side connector.

The first connector 20 (e.g., the first connector 22) may include a connector body 20a and a connector terminal 20b formed on the connector body 20a. For example, the connector body 20a may have a shape recessed from the rear 13a of the first display 10a. The connector body 20a may form a connector groove. For example, the connector terminal 20b may be formed of a conductive material that may transmit electrical signals and/or current.

The contents about the first connector 20 shown in FIG. 6 may also be applied to the second connector 30 and the fifth connector 40. Accordingly, the second connector 30 (e.g., the second connector 31) may include a connector body 30a and a connector terminal 30b, and the fifth connector 40 may also include a connector body and a connector terminal.

Referring to FIG. 7, the third connector 113 will be described as an example of a bracket side connector.

The third connector 113 may include a connector body 113a and a connector terminal 113b formed on the connector body 113a. The connector body 113a may have a shape corresponding to a shape of the connector body 20a (e.g., a shape of a recess of the connector body 20a). For example, the connector body 113a may have a shape that protrudes from the first hinge body 111. The connector body 113a may form a connector protrusion. However, embodiments of the present disclosure are not limited to this, and for example, the connector body 20a may have a shape that protrudes toward the connector body 113a, and the connector body 113a may have a recessed shape to correspond to the connector body 20a. For example, the connector terminal 113b may be formed of a conductive material that may transmit electrical signals and/or current. For example, the connector terminal 113b may be provided to contact the connector terminal 20b.

The contents of the third connector 113 shown in FIG. 7 may also be applied to the fourth connector 114. Accordingly, the fourth connector 114 may include a connector body 114a and a connector terminal 114b.

In FIG. 4, the hinge device is illustrated as being disposed in the middle of the display 10 in the Z directions, but the hinge device may be disposed in various positions such as the top, bottom, and middle of the display 10 with respect to the rear of the display 10. For example, the hinge device may be disposed adjacent to the third side portion 16 or the fourth side portion 17 of the display.

Detailed components of the hinge device will be described with reference to FIG. 8. For the sake of convenience of description, the following description will be made based on the first hinge device 101 that couples the first display 10*a* and the second display 10*b*. However, the description may be applied to the second hinge device 102 in the same way as the first hinge device 101.

The hinge device 100 may include a hinge 110. The hinge 110 may rotatably couple the plurality of displays 10. The hinge 110 may rotatably couple the first display 10*a* and the second display 10*b*.

The hinge 110 may include hinge bodies (e.g., a first hinge body 111 and a second hinge body 112). The hinge bodies may be formed to extend along one direction to couple the plurality of displays 10 together. For example, the hinge bodies may be formed to extend in the Y direction.

The hinge may include a first hinge body 111. The first hinge body 111 may include a first hinge portion 111*a* and a second hinge portion 111*b*. The first hinge portion 111*a* and the second hinge portion 111*b* may be rotatably coupled to each other. For example, the first hinge portion 111*a* and the second hinge portion 111*b* may be coupled based on a hinge axis 115*a* (e.g., a rotation axis). The first hinge portion 111*a* and the second hinge portion 111*b* may be disposed on opposite sides, respectively, of the hinge axis 115*a*. However, the first hinge portion 111*a* and the second hinge portion 111*b* may be provided as one part rather than being separately provided and coupled to each other, and may each be rotatable. The first hinge portion 111*a* and the second hinge portion 111*b* may be formed to extend in the Y direction.

Based on the hinge device 100 being coupled to the first display 10*a* and the second display 10*b*, the first hinge portion 111*a* may be disposed at a side of the first display 10*a*, and the second hinge portion 111*b* may be disposed at a side of the second display 10*b*.

The first hinge portion 111*a* may have a light emitter 120 disposed thereon. The second hinge portion 111*b* may have a light receiver 130 disposed thereon.

The hinge bodies may further include a second hinge body 112. The second hinge body 112 may be disposed between the first hinge body 111 and the displays 10. The second hinge body 112 may include a third hinge portion 112*a* and a fourth hinge portion 112*b*. The third hinge portion 112*a* and the fourth hinge portion 112*b* may be rotatably coupled to each other. For example, the third hinge portion 112*a* and the fourth hinge portion 112*b* may be coupled based on a hinge axis 115*b* (e.g., a rotation axis). The third hinge portion 112*a* and the fourth hinge portion 112*b* may be disposed on opposite sides of the hinge axis 115*b*. However, the third hinge portion 112*a* and the fourth hinge portion 112*b* may be provided as one part, rather than being separately provided and coupled to each other, and may each be rotatable. The third hinge portion 112*a* and the fourth hinge portion 112*b* may be formed to extend in the Y direction.

Based on the hinge device 100 being coupled to the first display 10*a* and the second display 10*b*, the third hinge portion 112*a* may be disposed at a side of the first display 10*a*, and the fourth hinge portion 112*b* may be disposed at a side of the second display 10*b*.

The third hinge portion 112*a* may have a third connector 113 thereon, and the fourth hinge portion 112*b* may have a fourth connector 114 thereon. Based on the hinge device 100 being coupled to the first display 10*a* and the second display 10*b*, the third connector 113 may be electrically connected to the first connector 20, and the fourth connector 114 may be electrically connected to the second connector 30.

The first hinge portion 111*a* and the third hinge portion 112*a* may rotate together with the first display 10*a*, and the second hinge portion 111*b* and the fourth hinge portion 112*b* may rotate with the second display 10*b*. Therefore, each of the angle between the first hinge portion 111*a* and the second hinge portion 111*b* and the angle between the third hinge portion 112*a* and the fourth hinge portion 112*b* may correspond to the angle between the first display 10*a* and the second display 10*b*.

However, in the first hinge body 111 and the second hinge body 112, the ordinal numbers such as "first" and "second" are not interpreted limitedly by the use of the ordinal numbers. For example, the first hinge body 111 may be disposed between the second hinge body 112 and the displays 10.

The hinge device 100 may include a light emitter 120. The light emitter 120 may be disposed on the first hinge portion 111*a* and emit light toward the second hinge portion 111*b*. The light emitter 120 may be a light emitting module.

The light emitter 120 may include a light source 122. The light source 122 may emit light to a sensor 133 disposed on the second hinge portion 111*b*. For example, light emitted from a light source may be infrared. The light source 122 may be disposed on a first substrate 121, and the light source 122 disposed on the first substrate 121 may be provided as a plurality of light sources 122. The plurality of light sources 122 may be arranged along one direction. For example, the plurality of light sources 122 may be arranged along the Y direction. The light source 122 may be the first light source.

The light emitter 120 may further include a substrate. The substrate of the light emitter 120 may be the first substrate 121. The first substrate 121 may be disposed on the first hinge portion 111*a*. For example, the first substrate 121 may have a first side 121*a* (see FIG. 12) that faces the third hinge portion 112*a* or the first display 10*a*. The first substrate 121 may have a second side 121*b* that is in contact with the first hinge portion 111*a*.

The first substrate 121 may be a first printed circuit board electrically connected to the light source 122. The first substrate 121 may be formed to extend in a direction different from a direction in which the first hinge portion 111*a* is formed to extend while the first substrate 121 is coupled to the first hinge portion 111*a*. For example, the first substrate 121 may be coupled to the first hinge portion 111*a* while extending in a direction perpendicular to the first hinge portion 111*a*. However, the arrangement of the first substrate 121 is not limited to the above. For example, while the first substrate 121 is coupled to the first hinge portion 111*a*, the first substrate 121 may be formed to extend in a direction parallel to the first hinge portion 111*a*.

The hinge device 100 may include a light receiver 130. The light receiver 130 may be disposed on the second hinge portion 111*b* and receive light from a side of the first hinge portion 111*a*. The light receiver 130 may be a detecting portion. The light receiver 130 may be a light receiving module.

The light receiver 130 may include a sensor 133. The sensor 133 may detect light emitted from the light source 122 disposed on the first hinge portion 111*a*. The sensor 133 may be a light sensor. For example, the sensor 133 may be an infrared sensor. The sensor 133 may detect the amount of light emitted from the light source 122 and transmit a signal to the controller 200 (see FIG. 22). The sensor 133 may be disposed on a second substrate 131, and the sensor 133 disposed on the second substrate 131 may be provided as a plurality of sensors 133. The plurality of sensors 133 may be arranged along one direction. For example, the plurality of sensors 133 may be arranged along the Y direction. The intensity of light detected by the plurality of sensors 133 may vary at each angle depending on the location. The sensor 133 may be the first sensor.

The light receiver 130 may further include a substrate. The substrate of the light receiver 130 may be the second substrate 131. The second substrate 131 may be disposed on the second hinge portion 111b. For example, the second substrate 131 may have a first side 131a (see FIG. 13) that faces the fourth hinge portion 112b or the second display 10b. The second substrate 131 may have a second side 131b (see FIG. 13) that is in contact with the second hinge portion 111b.

The second substrate 131 may be a second printed circuit board electrically connected to the sensor 133. The second substrate 131 may be formed to extend in a direction parallel to a direction in which the second hinge portion 111b is formed to extend while the second substrate 131 is coupled to the second hinge portion 111b. However, the arrangement of the second substrate 131 is not limited to the above example.

In the above description, the light emitter 120 is disposed on the first hinge portion 111a, and the light receiver 130 is disposed on the second hinge portion 111b. However, embodiments of the present disclosure are not limited thereto. For example, the light emitter 120 may be disposed on the second hinge portion 111b, and the light receiver 130 may be disposed on the first hinge portion 111a.

In addition, the light emitter 120 is shown to be spaced apart at a farther distance away, than the light receiver 130, from the hinge axis 115a (e.g., rotation axis), and the light receiver 130 is shown to be closer, than the light emitter 120, to the hinge axis 115a. However, embodiments of the present disclosure are not limited thereto. For example, the light emitter 120 may be disposed closer, than the light receiver 130, to the hinge axis 115a.

In addition, in the first hinge portion, the second hinge portion, the third hinge portion, and the fourth hinge portion, the ordinal numbers such as "first," "second," "third," and "fourth" are not interpreted limitedly by the use of the ordinal numbers. For example, the first hinge body may include a third hinge portion and a fourth hinge portion, or the second hinge body may include a first hinge portion and a second hinge portion. Accordingly, it may be understood that a light emitter may be disposed on a third hinge portion and a light receiver may be disposed on a fourth hinge portion.

Some of the components of the hinge device 100 described above may be omitted. For example, the first hinge body 111 and the second hinge body 112 may be formed as one part, or one of the first hinge body 111 and the second hinge body 112 may be omitted. When the second hinge body 112 is omitted, the third connector 113 and the fourth connector 114 provided on the second hinge body 112 may be provided on the first hinge body 111. Additionally, when the first hinge body 111 is omitted, the light emitter 120 and the light receiver 130 provided on the first hinge body 111 may be provided on the second hinge body 112.

Figure 9:
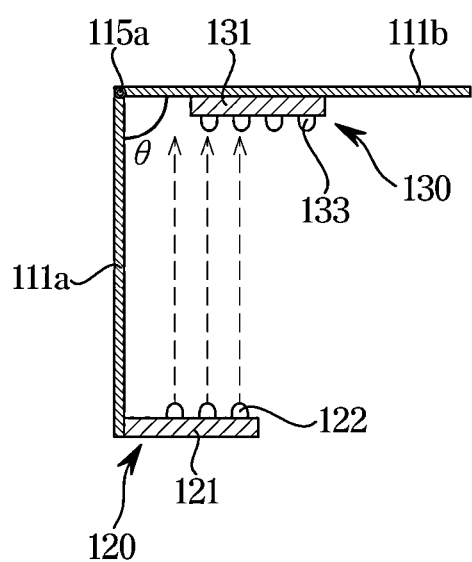
FIG. 9 is a schematic diagram of a hinge device in a display apparatus according to an embodiment.
Figure 10:
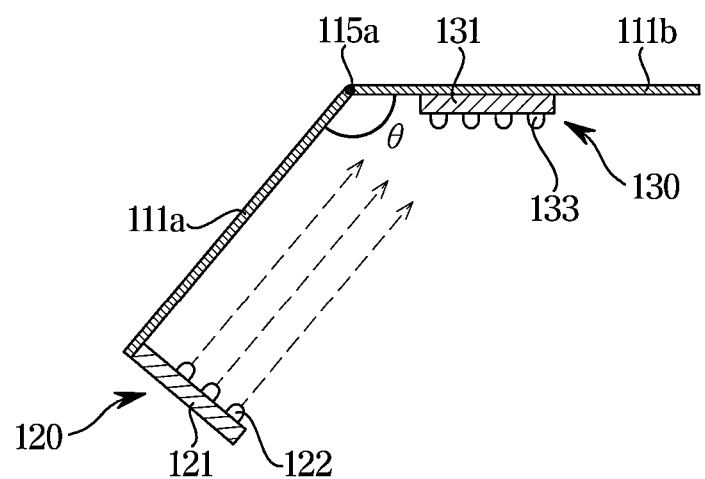
FIG. 10 is a schematic diagram of a hinge device in a display apparatus according to an embodiment.
Figure 11:
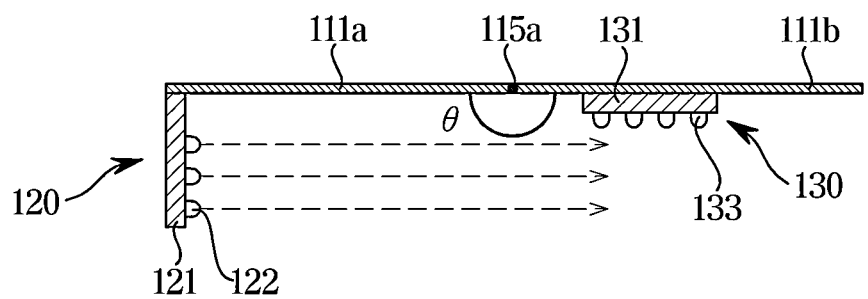
FIG. 11 is a schematic diagram of a hinge device in a display apparatus according to an embodiment.

FIG. 9 is a schematic diagram of a hinge device in a display apparatus according to an embodiment. FIG. 10 is a schematic diagram of a hinge device in a display apparatus according to an embodiment. FIG. 11 is a schematic diagram of a hinge device in a display apparatus according to an embodiment. FIGS. 9 to 11 are top views illustrating the cross section of the hinge device, and for the sake of convenience of descriptions, the following description is made based on the first hinge portion and the second hinge portion.

Referring to FIGS. 9 to 11, the first hinge portion 111a and the second hinge portion 111b may be rotatably coupled to each other. For example, the first hinge portion 111a and the second hinge portion 111b may have an angle in a range between 90 degrees and 180 degrees. FIG. 9 shows that the first hinge portion 111a and the second hinge portion 111b have an angle of 90 degrees, and FIG. 10 shows that the first hinge portion 111a and the second hinge portion 111b have an angle between 90 degrees to 180 degrees (e.g., 135 degrees). FIG. 11 shows that the first hinge portion 111a and the second hinge portion 111b have an angle of 180 degrees. When the first hinge portion 111a and the second hinge portion 111b have an angle of 180 degrees, they may be referred to as being parallel to each other. Since the first hinge portion 111a may rotate together with the first display 10a, and the second hinge portion 111b may rotate together with the second display 10b, the angle between the first hinge portion 111a and the second hinge portion 111b may correspond to the angle of the first display 10a and the second display 10b.

The light source 122 of the light emitter 120 may emit light toward the sensor 133. Since light travels in a straight line, the amount of light detected by the sensor 133 may vary depending on the angle between the first hinge portion 111a and the second hinge portion 111b. The sensor 133 may transmit information about the detected amount and/or intensity of light to the controller 200. The controller 200 may identify and/or determine the angle between the first display 10a and the second display 10b based on the detected amount and/or intensity of light, and control the displays 10.

For example, the amounts and/or intensities of light detected by the plurality of sensors 133 may differ by the placement location. Accordingly, the sensor 133 adjacent to the hinge axis (e.g., the hinge axis 115a) and the sensor 133 farther from the hinge axis may differ in the amount and/or intensity of light detected, depending on the angle between the first hinge portion 111a and the second hinge portion 111b. For example, the sensor 133 closest to the hinge axis may acquire a greater amount or intensity of detecting light as the angle between the first hinge portion 111a and the second hinge portion 111b is closer to 90 degrees, and the sensor 133 at a farther distance away from the hinge axis may acquire a greater amount and/or intensity of detecting light as the angle between the first hinge portion 111a and the second hinge portion 111b is closer to about 135 degrees. When the first hinge portion 111a and the second hinge portion 111b form an angle of 180 degrees, the amounts and/or intensities of detecting light acquired by the plurality of sensors 133 may be close to 0.

The controller 200 may identify and/or determine the angle between the first display 10a and the second display 10b based on the amount and/or intensity of light detected by each of the plurality of sensors 133, and control the displays 10.

Figure 12:
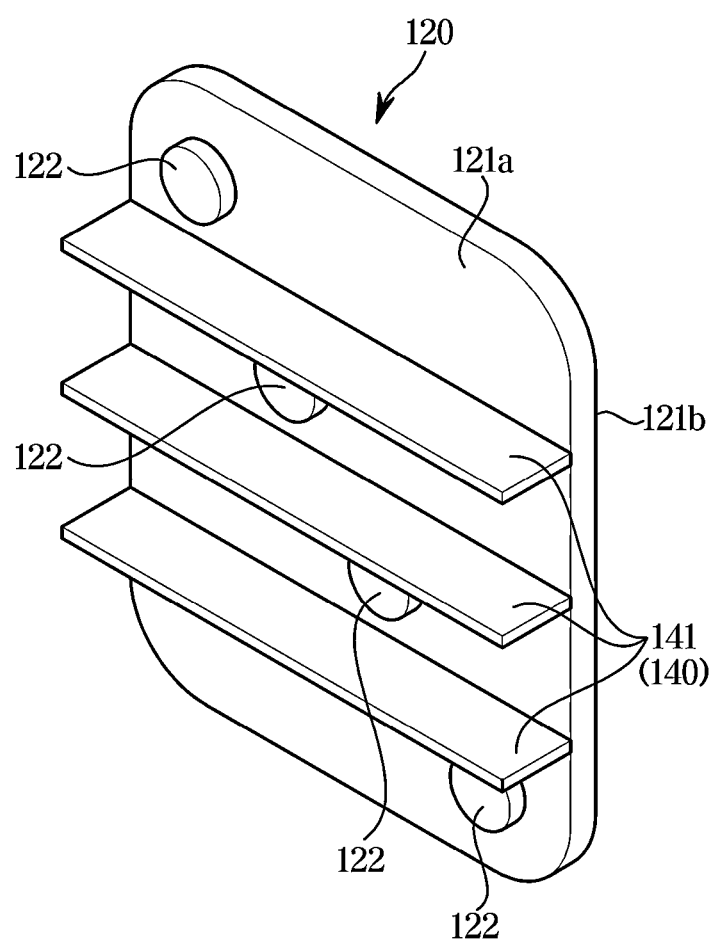
FIG. 12 is a schematic diagram of a light emitter in a display apparatus according to an embodiment.
Figure 13:
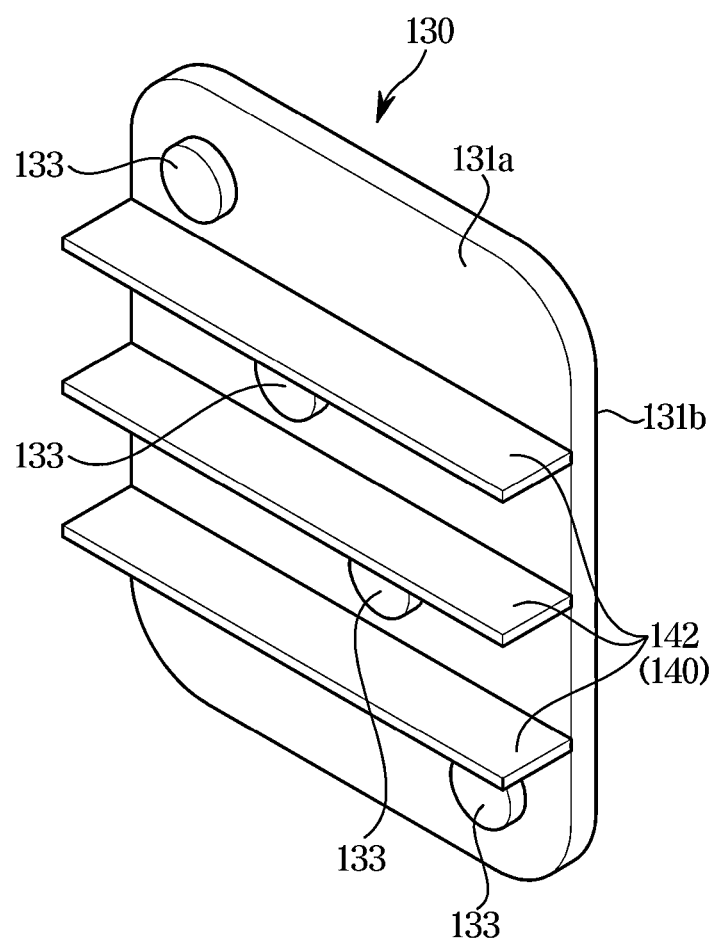
FIG. 13 is a schematic diagram of a light receiver in a display apparatus according to an embodiment.

FIG. 12 is a schematic diagram of a light emitter in a display apparatus according to an embodiment. FIG. 13 is a schematic diagram of a light receiver in a display apparatus according to an embodiment.

Referring to FIGS. 12 and 13, the light emitter 120 may include a first side 121a and a second side 121b. A light source 122 may be disposed on the first side 121a, and the second side 121b may be in contact with the hinge 110. The light receiver 130 may include a first side 131a and a second side 131b. A sensor 133 may be disposed on the first side 131a, and the second side 131b may be in contact with the hinge 110.

The plurality of light sources 122 may be arranged diagonally. The plurality of light sources 122 are disposed on the first substrate 121 and protrude, and the plurality of light sources 122 may be spaced apart. For example, the plurality of light sources 122 may gradually protrude further forward while the plurality of light sources 122 is mounted on the first substrate 121 and may be arranged at intervals.

The plurality of sensors 133 may be arranged diagonally. The plurality of sensors 133 are disposed on the second substrate 131 and protrude, and the plurality of sensors 133 may be spaced apart. For example, the plurality of sensors 133 may gradually protrude further forward while the plurality of sensors 133 is mounted the second substrate 131 and may be arranged at intervals. For example, a protrusion distance of front surfaces of the plurality of sensors 133 from the second substrate 131 may gradually increase in a direction (e.g., a vertical direction) in which the plurality of sensors 133 are arranged.

According to an embodiment, the plurality of sensors 133 and the plurality of light sources 122 may be arranged not only in the Y direction but also in the Z direction, and thus the sensors 133 may detect the amount and/or the intensity of light at different angles.

The hinge device 100 may include partitions 140. For example, the partition 140 may include a bar shape. The partition 140 may extend in one direction (e.g., Y directions).

Partitions 141 may be disposed between the plurality of light sources 122. The partition 141 may protrude between the plurality of light sources 122. The partition 141 may protrude from the first side 121a of the first substrate 121 on which the light source 122 is mounted. The partition 141 may block light coming from outside the hinge device 100 and/or noise caused by other light sources, thereby reducing errors in the amount of light or intensity of light detected by the sensor 133. The partition 141 may be provided as a plurality of partitions 141. A separate partition 141 may be disposed between each of the plurality of light sources 122.

Additionally, partitions 142 may be disposed between the plurality of sensors 133. The partition 142 may protrude between the plurality of sensors 133. The partition 142 may protrude from the first side 131a of the second substrate 131 on which the sensor 133 is mounted. The partition 142 may block light coming from outside the hinge device 100 and/or noise caused by other light sources, thereby reducing errors in the amount of light or intensity of light detected by the sensor 133. The partition 142 may be provided as a plurality of partitions 142. When a plurality of sensors 133 are provided, a separate partition 142 may be disposed between each of the plurality of sensors 133.

The arrangement of the plurality of partitions 140 (e.g., the partitions 141 and the partitions 142) is not limited thereto, and the plurality of partitions 140 may be disposed between the plurality of light sources 122 and the plurality of sensors 133 while extending in the Z direction.

Figure 14:
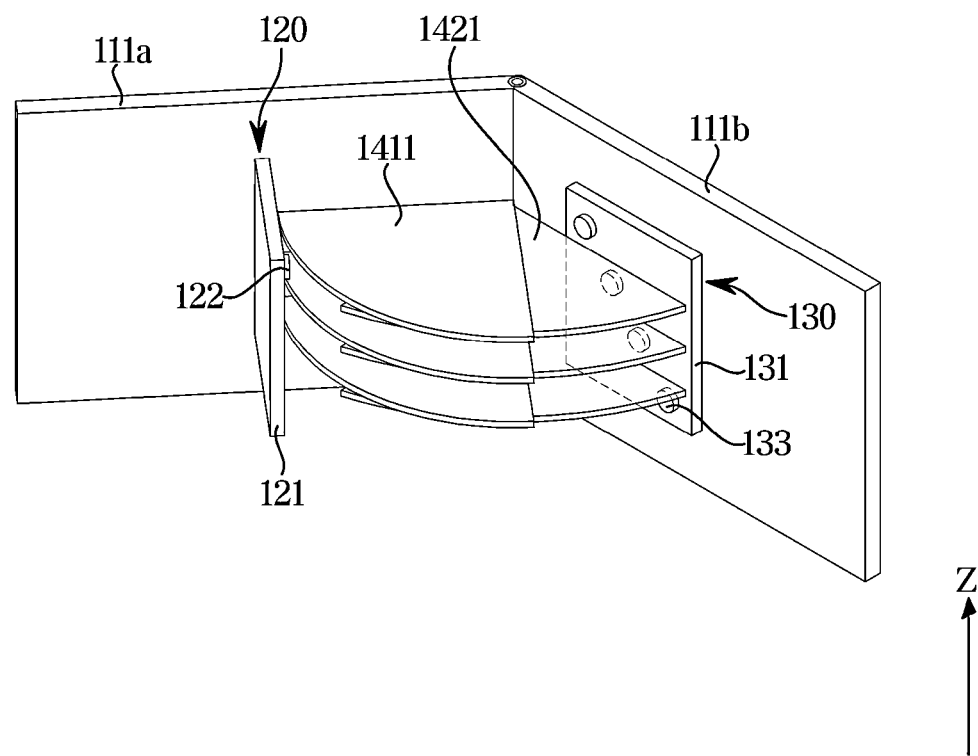
FIG. 14 is a schematic diagram of a hinge device in a display apparatus according to an embodiment.
Figure 15:
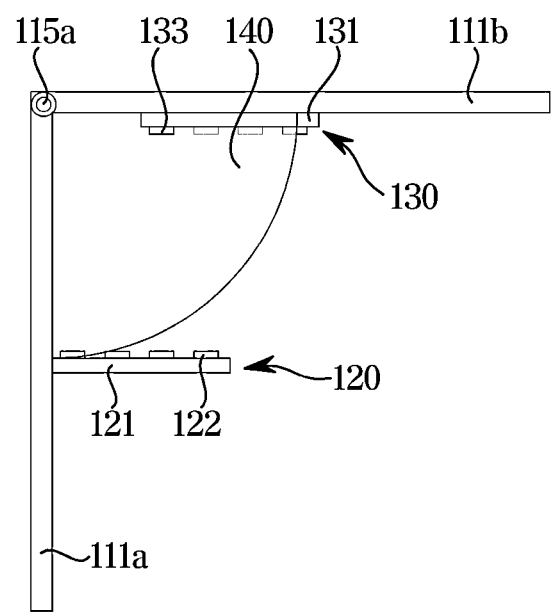
FIG. 15 is a schematic diagram of a hinge device in a display apparatus according to an embodiment.
Figure 16:
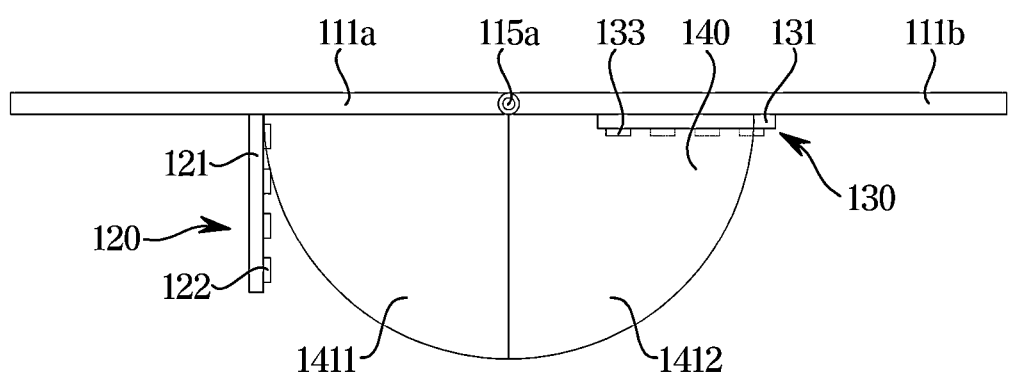
FIG. 16 is a schematic diagram of a hinge device in a display apparatus according to an embodiment.

FIG. 14 is a schematic diagram of a hinge device in a display apparatus according to an embodiment. FIG. 15 is a schematic diagram of a hinge device in a display apparatus according to an embodiment. FIG. 16 is a schematic diagram of a hinge device in a display apparatus according to an embodiment. FIG. 15 shows that the first hinge portion and the second hinge portion have an angle of 90 degrees therebetween, and FIG. 16 shows that the first hinge portion and the second hinge portion have an angle of 180 degrees therebetween. FIGS. 15 and 16 are top views of the hinge device.

Referring to FIGS. 14 to 16, the hinge device 100 may include a plurality of partitions 140. The plurality of partitions 140 may include first partitions 1411 coupled to the first hinge portion 111a and second partitions 1421 coupled to the second hinge portion 111b.

The first partitions 1411 and the second partitions 1421 may each have an arc shape. For example, the first partitions 1411 and the second partitions 1421 may have a ¼ circle shape. The first partitions 1411 and the second partitions 1421 may be arranged along the upper and lower direction. While the first hinge portion 111a and the second hinge portion 111b form an angle of 90 degrees, the first partitions 1411 and the second partitions 1421 may overlap each other when viewed from above and below (see FIG. 15). While the first hinge portion 111a and the second hinge portion 111b form an angle of 180 degrees, the first partitions 1411 and the second partitions 1421 may form a semicircular shape (see FIG. 16). Therefore, as the first partitions 1411 and the second partitions 1421 overlap each other, the first partitions 1411 and the second partitions may reduce the error of the sensors 133 due to external light without interfering with rotation of the first hinge portion 111a and the second hinge portion 111b from rotating between 90 degrees and 180 degrees. The first partitions 1411 and the second partitions 1421 may each be provided in plural along the vertical direction.

In FIG. 14, the first partitions 1411 are shown to be positioned above the second partitions 1421, but embodiments of the present disclosure are not limited thereto, and the second partitions 1421 may be positioned above the first partitions 1411.

Figure 17:
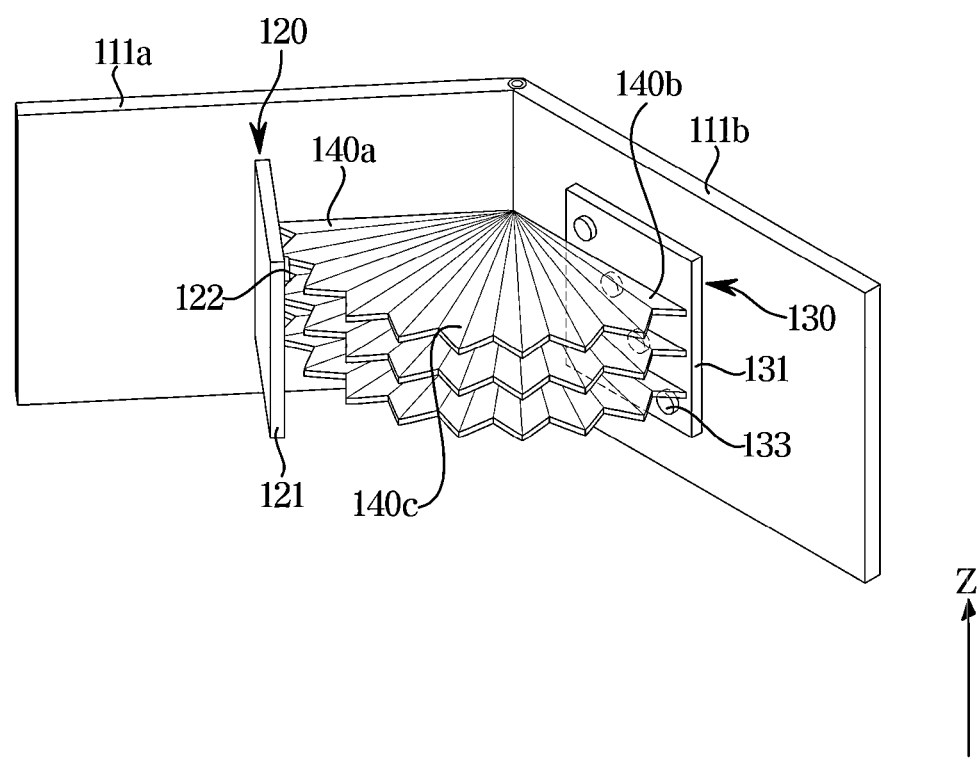
FIG. 17 is a schematic diagram of a hinge device in a display apparatus according to an embodiment.
Figure 18:
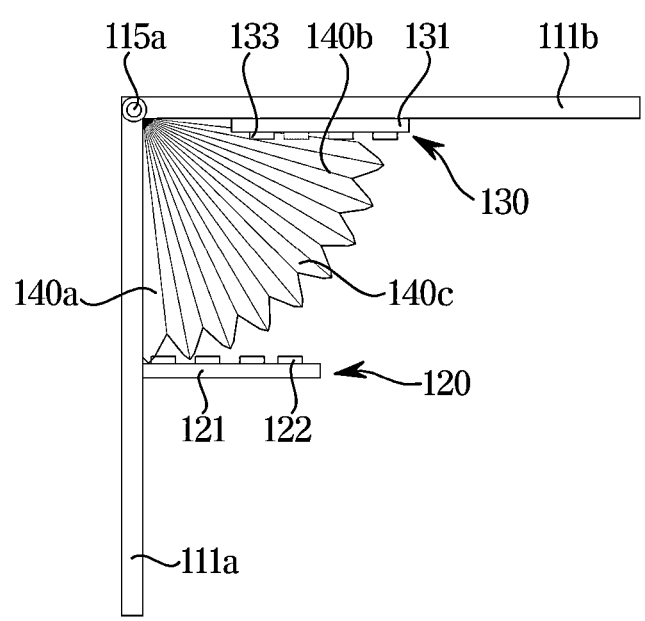
FIG. 18 is a schematic diagram of a hinge device in a display apparatus according to an embodiment.
Figure 19:
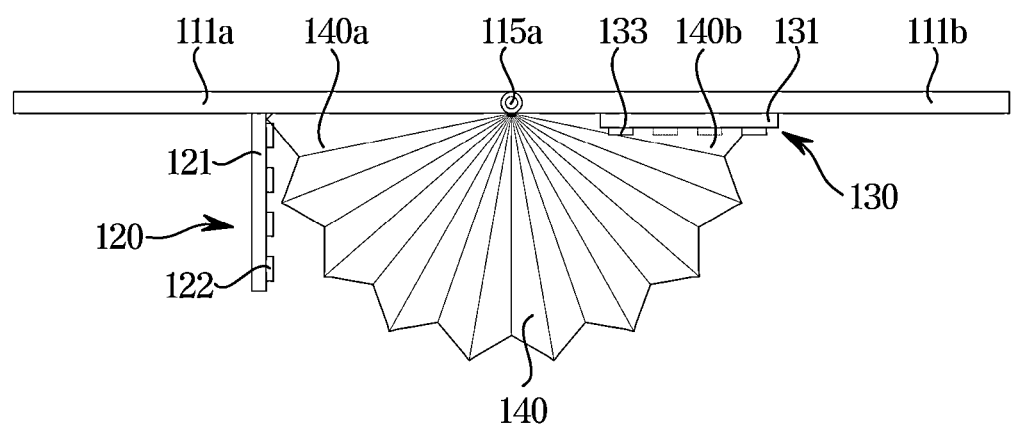
FIG. 19 is a schematic diagram of a hinge device in a display apparatus according to an embodiment.

FIG. 17 is a schematic diagram of a hinge device in a display apparatus according to an embodiment. FIG. 18 is a schematic diagram of a hinge device in a display apparatus according to an embodiment. FIG. 19 is a schematic diagram of a hinge device in a display apparatus according to an embodiment. FIG. 18 shows that the first hinge portion and the second hinge portion have an angle of 90 degrees therebetween, and FIG. 19 shows that the first hinge portion and the second hinge portion have an angle of 180 degrees therebetween. FIGS. 18 and 19 are top views of the hinge device.

Referring to FIGS. 17 to 19, the hinge device 100 may include a partition 140. When the first display 10a and the second display 10b rotate, the first hinge portion 111a and the second hinge portion 111b may be rotated, and the rotation of the first hinge portion 111a and the second hinge portion 111b may cause the partition 140 to be folded. The partition 140 may include a first partition portion 140a disposed on the first hinge portion 111a, a second partition portion 140b disposed on the second hinge portion 111b, and a third partition portion 140c that may be foldable between the first partition portion 140a and the second partition portion 140b. The third partition portion 140c may be a folding portion.

Therefore, since the partition 140 is foldable, the partition 140 may reduce errors occurring in the sensors 133 due to external light without interfering with rotation of the first hinge portion 111a and the second hinge portion 111b.

Figure 20:
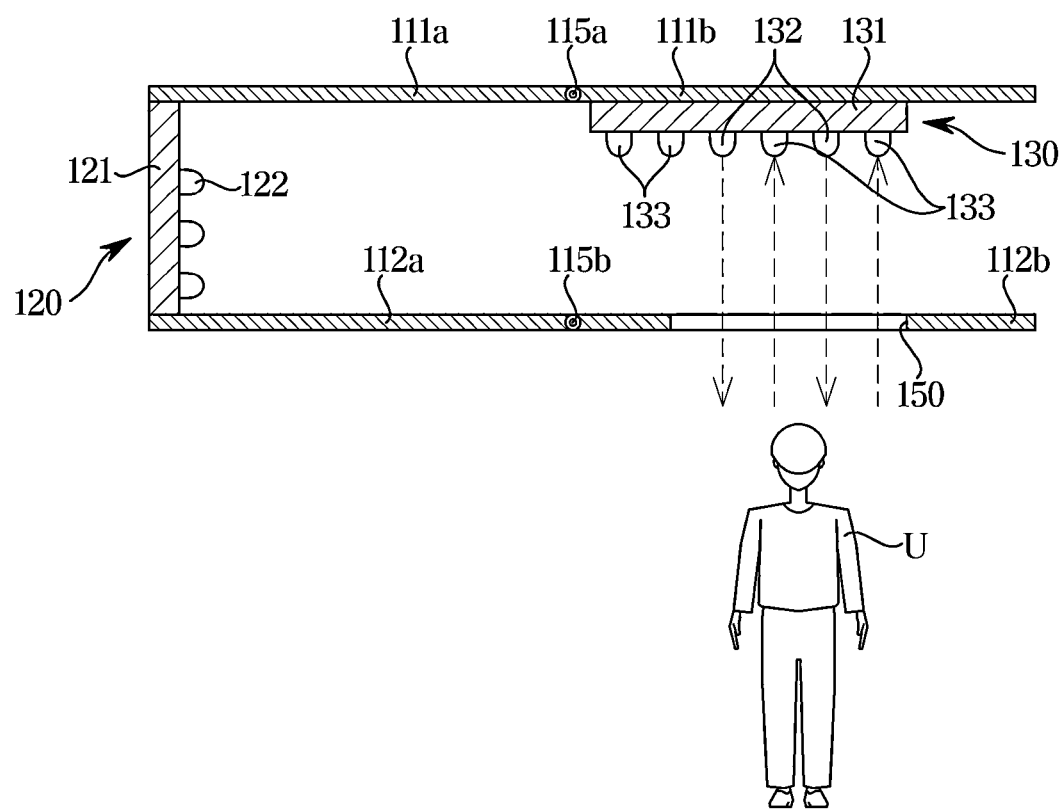
FIG. 20 is a schematic diagram of a hinge device in a display apparatus according to an embodiment.

FIG. 20 is a schematic diagram of a hinge device in a display apparatus according to an embodiment.

Referring to FIG. 20, the hinge device 100 may include a passing portion 150. The passing portion 150 may be formed in the second hinge body 112. The passing portion 150 may be a transmitting portion. For example, the passing portion 150 may be a through-hole in the second hinge body 112, and transparent glass may be disposed in the passing portion 150.

In the hinge device 100, the light receiver 130 may include a light source 132. The light source 132 may be mounted on the second substrate 131. The light source 132 may be disposed between the plurality of sensors 133. However, the location of the light source 132 is not limited thereto. The light source 132 may be provided as a plurality of light sources 132.

Light may be emitted from the light source 132 of the light receiver 130. Light emitted from the light source 132 of the light receiver 130 may pass through the passing portion 150 and then head to the outside of the hinge device 100. When a user U is located adjacent to the display apparatus, the light heading to the outside of the hinge device 100 may be reflected by the user U. Some of the reflected light may return through the passing portion 150 and head to the sensor 133. The sensor 133 may detect the reflected light. The sensor 133 may, in response to detecting the reflected light, transmit a signal to the controller 200. Accordingly, the controller 200 may control the display 10 based on a user being adjacent to the display apparatus.

For example, when the screens of the first display 10a and the second display 10b are in a turn-off state, the light source 122 of the light emitter 120 may be in an turn-off state, and the light source 132 of the light receiver 130 may be in a turn-on state. When a user U is adjacent to the display apparatus, the light emitted from the light source 132 of the light receiver 130 may be reflected by the user, and the sensor 133 may receive the reflected light. The controller 200 may turn on the screens of the displays 10 based on the received light. Afterwards, the light source 132 of the light receiver 130 may be turn off, the light source 122 of the light emitter 120 may be turned on, and the controller 200 may calculate the angle between the first hinge portion 111a and the second hinge portion 111b to perform additional control.

In FIG. 20, the first hinge portion 111a and the second hinge portion 111b are shown to have an angle of 180 degrees therebetween, and the third hinge portion 112a and the fourth hinge portion 112b are shown to have an angle of 180 degrees therebetween (that is, the first display 10a and the second display 10b form an angle of 180 degrees therebetween), but embodiments of the present disclosure are not limited thereto. Accordingly, the embodiment may be applied to various cases in which the first display 10a and the second display 10b form an angle between 90 degrees and 180 degrees.

Figure 21:
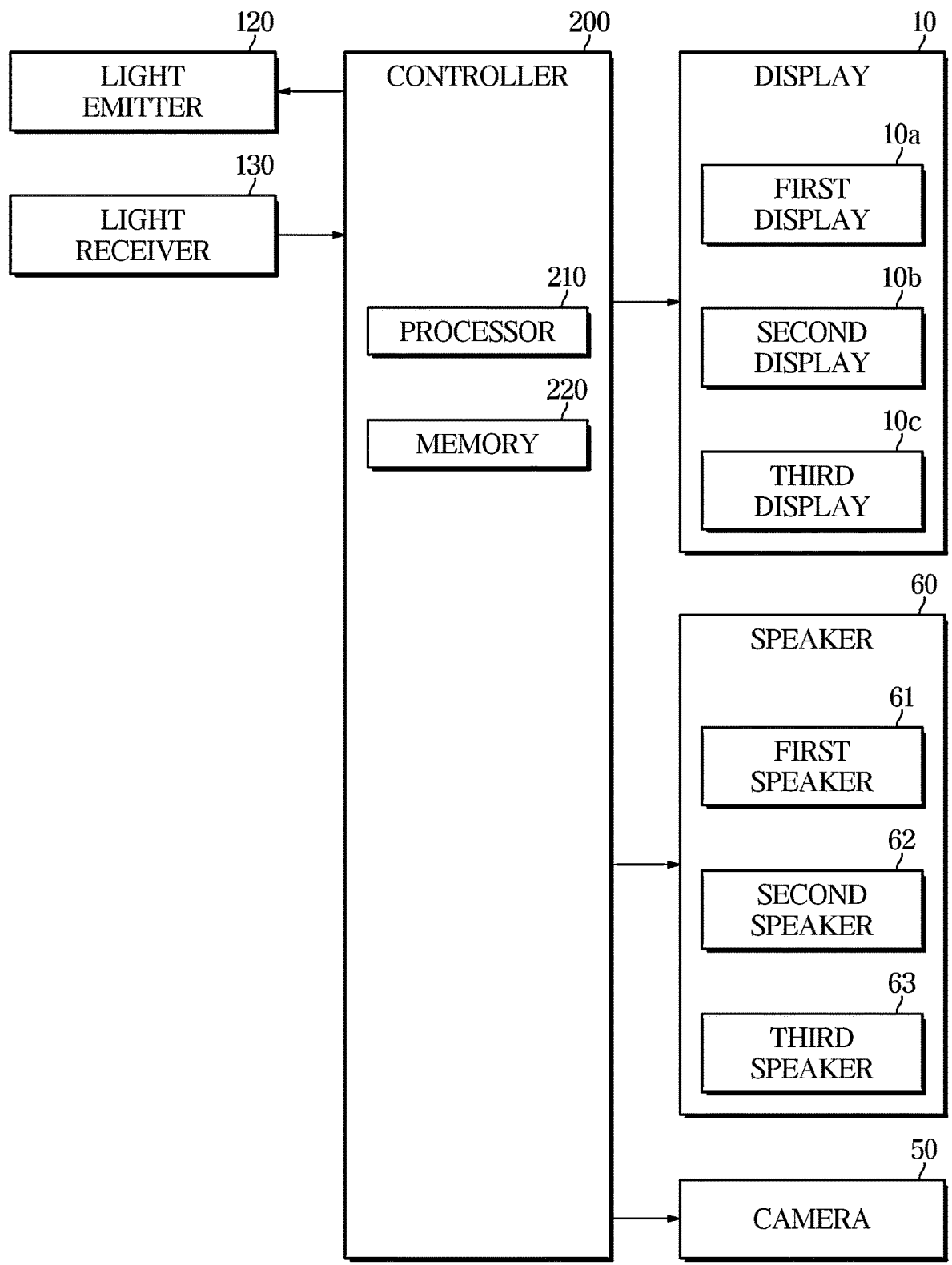
FIG. 21 is a control block diagram of a display apparatus according to an embodiment.

FIG. 21 is a control block diagram of a display apparatus according to an embodiment.

Referring to FIG. 21, the display apparatus may include a controller 200. The controller 200 may include hardware, such as a central processing unit (CPU), microcomputer (Micom), and/or a memory, and software, such as a control program. For example, the controller 200 may include at least one memory 220 that stores data regarding an algorithm for controlling the operation of components of the display apparatus and a program, and at least one processor 210 that performs the above-described operations and operations to be described below using the data stored in the at least one memory 220. The memory 220 and the processor 210 may each be implemented as separate chips. The processor 210 may include one or two or more processor chips or one or two or more processing cores. The memory 220 may include one or two or more memory chips or one or two or more memory blocks. Additionally, the memory 220 and the processor 210 may be implemented as a single chip. Chips constituting the controller 200 may be disposed inside the displays 10.

The controller 200 may be configured to control the light emitter 120. For example, the controller 200 may allow light to be output from the first light source of the light emitter 120. The light output from the first light source may be directed toward the light receiver 130.

The light receiver 130 may receive light output from the light emitter 120. For example, the sensor 133 of the light receiver 130 may transmit information about the intensity of light emitted from the light source to the controller 200. The controller 200 may receive information about the intensity of light from the light receiver 130 and control the displays 10.

The light receiver 130 may include a plurality of sensors 133, and the plurality of sensors 133 may differently detect intensities of light emitted from the light source 122. For example, the sensor 133 closest to the hinge axis 115a may detect the greatest intensity of light when the angle is near 90 degrees, and the intensity of detecting light may become less as the angle approaches 180 degrees. On the other hand, the sensor 133 at the farthest distance away from the hinge axis 115a may detect the greatest intensity of light in the process of the angle increasing from 90 degrees to 180 degrees, and the intensity of detecting light may become less as the angle approaches 180 degrees.

The controller 200 may calculate the angle between the first display 10a and the second display 10b according to the intensity of light detected by the plurality of sensors 133 of the light receiver 130. For example, in the first hinge device 101, the angle between the first hinge portion 111a and the second hinge portion 111b corresponds to the angle between the first display 10a and the second display 10b, and thus the controller 200 may determine the angle between the first hinge portion 111a and the second hinge portion 111b as the angle between the first display 10a and the second display 10b. In addition, for example, in the second hinge device 102, the angle between the first hinge portion 111a and the second hinge portion 111b corresponds to the angle between the second display 10b and the third display 10c, and thus the controller 200 may determine the angle between the first hinge portion 111a and the second hinge portion 111b as the angle between the second display 10b and the third display 10c.

The controller 200 may control the displays 10. The controller 200 may control the displays 10 based on information about the intensity of light collected and/or received by the light receiver 130. For example, as the angle between the first display 10a and the second display 10b changes, information about the intensity of light received and/or collected by the light receiver 130 of the first hinge device 101 may be subject to change. In response to a change in the intensity of light received and/or collected, the controller 200 may identify the angle between the first display 10a and the second display 10b, and adjust the image quality, brightness, and/or contrast.

For example, a user frequently may set a specific brightness value on the displays 10 at a specific angle (e.g., 135 degrees) between the first display 10a and the second display 10b, and the controller 200 may, upon determining that the angle between the first display 10a and the second display 10b is adjusted to 135 degrees, allow the displays 10 to have a preset brightness value. Accordingly, the user may use the displays 10 at a desired brightness value without any additional manipulation, thereby increasing convenience of use.

Additionally, for example, the user may transmit a first image to the first display 10a and the second display 10b and a second image to the third display 10c. In this case, in response to a user moving the third display 10c to form an angle of 90 degrees between the third display 10c and the second display 10b, the controller 200 may transmit the first image to the first display 10a and the second image to the second display 10b.

In addition, for example, in response to a user performing a motion such that the second display 10b and the third display 10c form an angle of 90 degrees therebetween, the controller 200 may turn off the third display 10c.

The display apparatus may include a speaker 60. The speaker 60 may be provided as at least one speaker. For example, the at least one speaker 60 may include a first speaker 61 provided on a side of the first display 10a, a second speaker 62 provided on a side of the second display 10b, and a third speaker 63 provided on a side of the third display 10c.

For example, the controller 200 may adjust the sound of the first speaker 61 and/or the second speaker 62 based on the angle between the first display 10a and the second display 10b. For example, in response to the first display 10a and the second display 10b forming 180 degrees being folded a certain angle or more or the first display 10a and the second display 10b forming 90 degrees being unfolded a certain angle or more, the controller 200 may allow the sound output from the first speaker 61 and/or the second speaker 62 to be changed. For example, the controller 200 may change the equalizer value of the first speaker 61 and/or the second speaker 62 or change the volume of the first speaker 61 and/or the second speaker 62. Additionally, the controller 200 may control the first speaker 61 and/or the second speaker 62 to perform a woofer function. Accordingly, the user may change the output of the speaker 60 without any additional manipulation, thereby increasing convenience of use. Additionally, an environment in which users may focus more on the transmitted images or videos may be implemented.

The speaker 60 may also be included in the display 10. For example, the speaker 60 may be built into the display 10. For example, the first speaker 61 may be built into the first display 10a, the second speaker 62 may be built into the second display 10b, and the third speaker 63 may be built into the third display 10c.

The position of the speaker 60 is not limited to the above example. For example, the first speaker 61 may be spaced apart from the first display 10a, the second speaker 62 may be spaced apart from the second display 10b, and the third display 10c may be spaced apart from the third display 10c.

The controller 200 may, upon identifying that the first display 10a and the second display 10b form a predetermined angle, operate an application and/or program stored in the memory 220. For example, in response to a predetermined angle being formed by the displays 10 during transmission of images and/or videos, the controller 200 may execute a video conference program stored in the memory 220.

The display apparatus may further include at least one camera 50. For example, a camera may be installed on at least one of the displays 10. The controller 200 may allow the camera 50 to be driven or electrically connected to the displays 10 in response to a predetermined angle being formed by the displays 10 during transmission of images and/or videos. Accordingly, the user may operate the camera 50, programs, and/or applications without any additional manipulation, thereby increasing convenience of use.

Additionally, a light source 132 may be disposed on the light receiver 130, and light emitted from the light source 132 may be transmitted through the passing portion 150 and reflected by the user. The reflected light may pass through the passing portion 150, and the sensor 133 may detect the reflected light. For example, while all of the displays 10 are turned off, the light source 122 of the light emitter 120 may be in a turn-off state and the light source 132 of the light receiver 130 may be in an turn-on state. In this case, the sensor 133 may collect the reflected light, and the controller 200 may, upon identifying that the intensity of the collected light is greater than or equal to a predetermined value and/or less than or equal to a predetermined value, identify that a user has arrived at the office or located in front of the display apparatus 1, and allow the display 10 to be turned on (see FIG. 20). Afterwards, the light source 132 of the light receiver 130 may be turned off, the light source 122 of the light emitter 120 may turned on, and the controller 200 may calculate the angle between the first hinge portion 111a and the second hinge portion 111b to perform additional control.

Accordingly, the user may use the display 10 without additional operations to turn on the display 10, thereby increasing user convenience.

According to one aspect of embodiments of the present disclosure, a hinge device capable of electrically connecting a plurality of displays and controlling a plurality of displays, speakers, cameras, and the like based on the angle between the plurality of displays, and a display apparatus including the same can be provided.

The effects of embodiments of the present disclosure are not limited to the above-described effects, and effects not described may be clearly understood by those of ordinary skill in the art from the present disclosure.

A display apparatus according to an embodiment may include a first display 10a, a second display 10b disposed adjacent to the first display, and a hinge rotatably coupling the first display and the second display, the hinge including a first hinge portion 111a disposed at a side of the first display and a second hinge portion 111b rotatably coupled to the first hinge portion and disposed at a side of the second display 10b.

The display apparatus according to the embodiment may further include a light emitter 120 disposed on the first hinge portion, a light receiver 130 disposed on the second hinge portion, and a controller 200 configured to control the first display and the second display based on an intensity of light received by the light receiver while the light emitter emits light.

The controller may be configured to determine an angle between the first display and the second display based on the intensity of the received light, and to control the first display and the second display according to the determined angle.

The display apparatus may include a first speaker 61 provided on or in the first display and a second speaker 62 provided on or in the second display, and the controller may be configured to adjust sound of the first speaker and the second speaker based on the angle between the first display and the second display.

The controller may be configured to adjust a brightness and a contrast of the first display and the second display based on the angle between the first display and the second display.

The controller may be configured to execute a predetermined application based on the angle between the first display and the second display.

The display apparatus may further include a camera 50 provided on at least one from among the first display and the second display, wherein the controller may be configured to operate the camera based on the angle between the first display and the second display.

The first display may be disposed at one side of the second display, the hinge is a first hinge, the light emitter is a first light emitter, and the light receiver is a first light receiver. The display apparatus may include: a third display 10c located at the other side of the second display adjacent to the second display; a second hinge (e.g., hinge 110) rotatably coupling the second display and the third display, the second hinge including a first hinge portion 111a mounted on the second display and a second hinge portion 111b rotatably coupled to the first hinge portion of the second hinge and mounted on the third display; a second light emitter (e.g., a light emitter 120) disposed on the first hinge portion of the second hinge; and a second light receiver (e.g., a light receiver 130) disposed on the second hinge portion of the second hinge, wherein the controller may, based on an intensity of light received by the second light receiver while the second light emitter emits light, turn off the third display and turn on the first display and the second display.

The hinge may include: a first hinge body 111 including the first hinge portion and the second hinge portion; a second hinge body 112 disposed between the first hinge body and the first display and the second display; and a passing portion 150 formed on the second hinge body and configured to allow light to pass therethrough, wherein the light emitter may include a first substrate 121 and a first light source (e.g., a light source 122) electrically connected to the first substrate, and the light receiver may include a second substrate 131, a sensor 133 electrically connected to the second substrate, and a second light source (e.g., a light source 132) electrically connected to the second substrate, emitted light from which passes through the passing portion. The light emitted from the second light source is transmitted through the passing portion, and reflected to return through the passing portion and detected by the sensor. The controller may, based on the reflected light being detected by the sensor, display images on the first display and the second display.

The light emitter may include a first substrate 121 and a light source 122 electrically connected to the first substrate, and the light receiver may include a second substrate 131 and a sensor 133 electrically connected to the second substrate. The first substrate may be formed to extend in a direction perpendicular to an extension direction of the first hinge portion while the first substrate is coupled to the first hinge portion such that the light source emits light toward the sensor.

The second substrate may be formed to extend in a direction parallel to an extension direction of the second hinge portion while the second substrate is coupled to the second hinge portion such that the sensor detects light emitted from the light source.

The first display may include a first connector 20, the second display may include a second connector 30, and the hinge may further include a third hinge portion 112a disposed between the first hinge portion and the first display, a fourth hinge portion 112b disposed between the second hinge portion and the second display, a third connector 113 provided on the third hinge portion to be electrically connectable to the first connector, and a fourth connector 114 provided on the fourth hinge portion to be electrically connectable to the second connector, wherein the first display and the second display may be electrically connected to each other while the first connector and the third connector are connected and the second connector and the fourth connector are connected.

The sensor 133 may be provided as a plurality of sensors along one direction, and the display apparatus may include a plurality of partitions 140 disposed between the plurality of sensors to block external light.

The plurality of partitions 140 may include a first partition 1411 coupled to the first hinge portion and having an arc shape and a second partition 1412 coupled to the second hinge portion and having an arc shape, wherein the first partition and the second partition may together form a semicircle while the first hinge portion and the second hinge portion are arranged in parallel.

The plurality of partitions may be configured to be coupled to the first hinge portion and the second hinge portion and foldable based on an angle between the first display and the second display.

The plurality of sensors may be configured to gradually protrude further along the vertical direction. For example, a protrusion distance of the plurality of sensors from the first substrate increases, among the plurality of sensors, along the one direction, and wherein the one direction is a vertical direction.

A display apparatus according to an embodiment may include: a first hinge portion 111a; a second hinge portion 111b rotatably coupled to the first hinge portion; a third hinge portion 112a disposed between the first hinge portion and the first display to be mounted on the first display; and a fourth hinge portion 112b rotatably coupled to the third hinge portion and disposed between the second hinge portion and the second display to be mounted on the second display.

The display apparatus according to the embodiment may further include a light source 122 disposed on the first hinge portion and a light sensor (e.g., a sensor 133) disposed on the second hinge portion to detect output light while the light source outputs light.

The display apparatus may include: a first connector 20 provided on the third hinge portion to electrically connect the first display and the hinge device; and a second connector 30 provided on the fourth hinge portion to electrically connect the second display to the hinge device, wherein the first display and the second display may be electrically connected while the first connector is electrically connected to the first display, and the second connector is electrically connected to the second display.

The display apparatus may further include a first substrate 121 disposed on the first hinge portion and to which the light source is electrically connected, and a second substrate 131 disposed on the second hinge portion and to which the sensor is electrically connected, wherein the first substrate may be formed to extend in a direction different from an extension direction of the first hinge portion while the first substrate is disposed on the first hinge portion such that the light source emits light toward the sensor.

The first substrate 121 may be formed to extend in a direction perpendicular to the extension direction of the first hinge portion while the first substrate is disposed on the first hinge portion, and the second substrate 131 may be formed to extend in a direction parallel to the extension direction of the second hinge portion while the second substrate is disposed on the second hinge portion.

A display apparatus according to an embodiment may include: a first display 10a including a first connector 20; a second display 10b disposed adjacent to the first display and including a second connector 30; and a hinge 110 coupleable to the first display and the second display, wherein the hinge may include; a first hinge portion 111a and a second hinge portion 111b that may be mounted on the first display and the second display, respectively, while the first display is coupled to the second display; a third connector 113 disposed on the first hinge portion and electrically connected to the first connector; and a fourth connector 114 disposed on the second hinge portion and electrically connectable to the second connector.

The display apparatus according to the embodiment may further include: a plurality of light sources 122 disposed on the first hinge portion; a plurality of light sensors (e.g., sensors 133) disposed on the second hinge portion to detect light emitted from the plurality of light sources; and a controller 200 configured to determine the angle between the first display and the second display based on an intensity of light output from the plurality of light sources while the first display and the second display are electrically connected to each other through the hinge, and to control the first display and the second display according to the determined angle.

Although certain non-limiting example embodiments have been described herein, other embodiments and modifications will be apparent from this description. Accordingly, embodiments of the present disclosure are not limited to such example embodiments, and embodiments of the present disclosure include various modifications and equivalent arrangements as would be apparent to a person of ordinary skill in the art.

What is claimed is:

1. A display apparatus comprising:
a first display;
a second display adjacent to the first display;
a hinge rotatably coupling the first display and the second display, the hinge comprising:
a first hinge portion at a side of the first display; and
a second hinge portion rotatably coupled to the first hinge portion and at a side of the second display;
a light emitter on the first hinge portion;
a light receiver on the second hinge portion; and
a controller configured to control the first display and the second display based on an intensity of light received by the light receiver while the light emitter outputs the light.

2. The display apparatus of claim 1, wherein the controller is further configured to determine an angle between the first display and the second display based on the intensity of the light that is received, and control the first display and the second display according to the angle that is determined.

3. The display apparatus of claim 2, further comprising:
a first speaker on or in the first display; and
a second speaker on or in the second display,
wherein the controller is further configured to adjust sound of the first speaker and the second speaker based on the angle between the first display and the second display.

4. The display apparatus of claim 2, wherein the controller is further configured to adjust a brightness and a contrast of the first display and the second display based on the angle between the first display and the second display.

5. The display apparatus of claim 2, wherein the controller is configured to execute a predetermined application based on the angle between the first display and the second display.

6. The display apparatus of claim 2, further comprising a camera on at least one from among the first display and the second display,
wherein the controller is configured to operate the camera based on the angle between the first display and the second display.

7. The display apparatus of claim 2, wherein the first display is at a first side of the second display,
wherein the hinge is a first hinge, the light emitter is a first light emitter, and the light receiver is a first light receiver, and
wherein the display apparatus further comprises:
a third display adjacent to the second display at a second side of the second display, opposite to the first side;
a second hinge rotatably coupling the second display and the third display, the second hinge comprising:
a first hinge portion on the second display; and
a second hinge portion rotatably coupled to the first hinge portion of the second hinge and on the third display;
a second light emitter on the first hinge portion of the second hinge; and
a second light receiver on the second hinge portion of the second hinge,
wherein the controller is further configured to turn off the third display and turn on the first display and the second display based on an intensity of light received by the second light receiver while the second light emitter outputs light.

8. The display apparatus of claim 2, wherein the hinge further comprises:
a first hinge body comprising the first hinge portion and the second hinge portion;
a second hinge body between the first hinge body, and the first display and the second display; and
a passing portion formed through the second hinge body and configured to transmit light,
wherein the light emitter comprises a first substrate and a first light source electrically connected to the first substrate,
wherein the light receiver comprises a second substrate;
a sensor electrically connected to the second substrate; and
a second light source electrically connected to the second substrate, the second light source configured to emit light that passes through the passing portion,
wherein the light emitted from the second light source is transmitted through the passing portion, and reflected such as to return through the passing portion and be detected by the sensor, and
wherein the controller is further configured to display an image on the first display and the second display based on the light, that is reflected, being detected by the sensor.

9. The display apparatus of claim 1, wherein the light emitter comprises a first substrate and a light source electrically connected to the first substrate,
wherein the light receiver comprises a second substrate and at least one sensor electrically connected to the second substrate,
wherein the first substrate extends in a direction perpendicular to an extension direction of the first hinge portion while the first substrate is coupled to the first hinge portion such that the light source is configured to emit light toward the at least one sensor.

10. The display apparatus of claim 9, wherein the second substrate is extends in a direction parallel to an extension direction of the second hinge portion while the second substrate is coupled to the second hinge portion such that the at least one sensor is configured to detect the light emitted from the light source.

11. The display apparatus of claim 9, wherein
the first display comprises a first connector,
the second display comprises a second connector, and
wherein the hinge further comprises:
a third hinge portion between the first hinge portion and the first display;
a fourth hinge portion between the second hinge portion and the second display;
a third connector on the third hinge portion and configured to be electrically connected to the first connector; and
a fourth connector on the fourth hinge portion and configured to be electrically connected to the second connector, and
the first display and the second display are configured to be electrically connected to each other by the first connector and the third connector being connected to each other and the second connector and the fourth connector being connected to each other.

12. The display apparatus of claim 9, wherein the at least one sensor comprises a plurality of sensors disposed along one direction, and
the display apparatus further comprises a plurality of partitions between the plurality of sensors, the plurality of partitions configured to block external light.

13. The display apparatus of claim 12, wherein the plurality of partitions comprise:
a first partition coupled to the first hinge portion and having an arc shape; and
a second partition coupled to the second hinge portion and having an arc shape,
wherein the first partition and the second partition are together configured to form a semicircle while the first hinge portion and the second hinge portion are arranged in parallel.

14. The display apparatus of claim 12, wherein the plurality of partitions are coupled to the first hinge portion and the second hinge portion, and are configured to be foldable based on an angle between the first display and the second display.

15. The display apparatus of claim 12, wherein a protrusion distance of the plurality of sensors from the first substrate increases, among the plurality of sensors, along the one direction, and
wherein the one direction is a vertical direction.

16. A display apparatus comprising:
a first display;
a second display adjacent to the first display;
a hinge rotatably coupling the first display and the second display, the hinge comprising:
a first hinge portion at a side of the first display; and
a second hinge portion rotatably coupled to the first hinge portion and at a side of the second display;
a light emitter on the first hinge portion, the light emitter comprising a first substrate, and a light source electrically connected to the first substrate and configured to emit light; and
a light receiver on the second hinge portion, the light receiver comprising a second substrate, and at least one sensor electrically connected to the second substrate and configured to detect the light emitted from the light source,
wherein the first substrate extends in a direction perpendicular to an extension direction of the first hinge portion while the first substrate is coupled to the first hinge portion such that the light source is configured to emit light toward the at least one sensor.

17. The display apparatus of claim 16, wherein the second substrate is extends in a direction parallel to an extension direction of the second hinge portion while the second substrate is coupled to the second hinge portion such that the at least one sensor is configured to detect the light emitted from the light source.

18. The display apparatus of claim 16, wherein
the first display comprises a first connector,
the second display comprises a second connector, and
wherein the hinge further comprises:
a third hinge portion between the first hinge portion and the first display;
a fourth hinge portion between the second hinge portion and the second display;
a third connector on the third hinge portion and electrically connected to the first connector; and
a fourth connector on the fourth hinge portion and electrically connected to the second connector, and
the first display and the second display are configured to be electrically connected to each other by the first connector and the third connector being connected to each other and the second connector and the fourth connector being connected to each other.

19. The display apparatus of claim 16, wherein the at least one sensor comprises a plurality of sensors disposed along one direction, and
the display apparatus further comprises a plurality of partitions between the plurality of sensors, the plurality of partitions configured to block external light.

20. A method performed by a display apparatus that includes a first display, a second display adjacent to the first display, and a hinge rotatably coupling the first display and the second display, the method comprising:
emitting light by a light emitter, wherein the light emitter is on a first hinge portion of the hinge that is at a side of the first display;
receiving the light by a light receiver, wherein the light receiver is on a second hinge portion of the hinge that is rotatably coupled to the first hinge portion and at a side of the second display; and
controlling, by a controller of the display apparatus, the first display and the second display based on an intensity of the light received by the light receiver while the light emitter outputs the light.

\* \* \* \* \*